(12) United States Patent
Noguchi et al.

(10) Patent No.: US 8,217,387 B2
(45) Date of Patent: Jul. 10, 2012

(54) POLYMER COMPOUND AND LIGHT EMITTING DEVICE USING THE SAME

(75) Inventors: Takanobu Noguchi, Ibaraki (JP);
Tomoyuki Suzuki, Kanagawa (JP);
Makoto Anryu, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 576 days.

(21) Appl. No.: 12/375,026

(22) PCT Filed: Jul. 26, 2007

(86) PCT No.: PCT/JP2007/065115
§ 371 (c)(1),
(2), (4) Date: Jan. 26, 2009

(87) PCT Pub. No.: WO2008/016091
PCT Pub. Date: Feb. 7, 2008

(65) Prior Publication Data
US 2010/0001263 A1    Jan. 7, 2010

(30) Foreign Application Priority Data

Jul. 31, 2006   (JP) .................................. 2006-207727

(51) Int. Cl.
*H01L 35/24* (2006.01)
(52) U.S. Cl. .................. 257/40; 257/E51.001; 585/428; 585/435
(58) Field of Classification Search .................... 257/40, 257/E51.001; 585/428, 435
See application file for complete search history.

(56) References Cited

U.S. PATENT DOCUMENTS

| | | | |
|---|---|---|---|
| 6,905,785 B2 | 6/2005 | Noguchi et al. | |
| 8,012,603 B2* | 9/2011 | Doi et al. ....................... | 428/690 |
| 2002/0064680 A1 | 5/2002 | Spreitzer et al. | |
| 2004/0002576 A1 | 1/2004 | Oguma et al. | |
| 2004/0115473 A1 | 6/2004 | Burroughes et al. | |
| 2004/0234810 A1 | 11/2004 | Doi et al. | |
| 2005/0038223 A1 | 2/2005 | Becker et al. | |
| 2006/0199943 A1 | 9/2006 | Falcou et al. | |
| 2007/0073052 A1* | 3/2007 | Velusamy et al. .................. | 540/1 |
| 2008/0138651 A1 | 6/2008 | Doi et al. | |

FOREIGN PATENT DOCUMENTS

| | | |
|---|---|---|
| EP | 1571170 A1 | 9/2005 |
| JP | 61-103923 A | 5/1986 |
| JP | 8-185980 A | 7/1996 |
| JP | 2001-247861 A | 9/2001 |
| JP | 2004-002703 A | 1/2004 |
| JP | 2004-168999 A | 7/2004 |
| JP | 2004-534863 A | 11/2004 |
| WO | 00/46321 A1 | 8/2000 |
| WO | 02/059121 A1 | 8/2002 |
| WO | 03/020790 A2 | 3/2003 |
| WO | 2005/030827 A1 | 4/2005 |

OTHER PUBLICATIONS

Li et al, "Synthesis and properties of novel poly(p-phenylenevinylene) copolymers for near-infrared emitting diodes," European Polymer Journal, 41, 2005, pp. 2923-2933.*
Xianzhen Li, et al., European Polymer Journal, 2005, vol. 41, pp. 2923-2933.
Xuelong Zhang, et al., "Highly dichroic benzo-2,1,3-thiadiazole dyes containing five linearly η-conjugated aromatic residues, with fluorescent emission ranging from green to red, in a liquid crystal guest-host system", Journal of Materials Chemistry, The Royal Society of Chemistry, Cambridge, GB, vol. 16, No. 8, Feb. 28, 2006, pp. 736-740 (XP008105127).
Ben Liu et al., "Design and Synthesis of Bipyridyl-Containing Conjugated Polymers: Effects of polymer Rigidity on Metal Ion Sensing", Macromolecules, vol. 34, 2001, pp. 7932-7940.
H.C. Li et al., "Synthesis and properties of alternating copolymers containing PPV and hole-transporting units for light-emitting devices", Synthetic Metals, vol. 119, 2001, pp. 149-150.
Weiling Wang et al., "Alternating Aromatic and Tansannular Chromophores with and without Linker: Effect of Transannular n-n Interaction on the Optical Property of Dithiaparacyclophane-based Copolymers", Macromolecules, vol. 37, 2004, pp. 3546-3553.
TziYi Wu and Yun Chen, "Synthesis and Characterization of Novel Luminescent Polymers with Alternative Phenothiazine and Divinylbenzene Units", Journal of Polymer Science: Part A: Polymer Chemistry, vol. 40, 2002, pp. 4452-4462.
Chenggang Wang et al., "poly(3',4'-dibutyl-a-terthiophene-phenylene-vinylene): a new soluble and dopable phenylene-vinylene-based conjugated polymer", Synthetic Metals, vol. 74, 1995, pp. 71-74.

* cited by examiner

*Primary Examiner* — Anthony Ho
(74) *Attorney, Agent, or Firm* — Sughrue Mion, PLLC

(57) ABSTRACT

A polymer compound comprising a repeating unit of the following formula (1) and having a polystyrene-reduced number average molecular weight of $1 \times 10^3$ to $1 \times 10^8$:

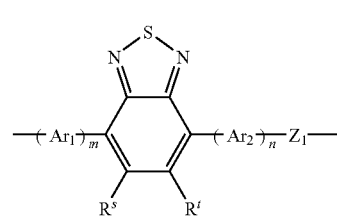

(1)

[wherein, $Ar_1$ and $Ar_2$ represent an arylene group, divalent heterocyclic group or divalent aromatic amine group. $Z_1$ represents $-CR_1=CR_2-$ or $-C\equiv C-$. Here, $R_1$ and $R_2$ represent a hydrogen atom, alkyl group, aryl group or the like. m and n represent 1 or 2. $R^s$ and $R^t$ represent a hydrogen atom, alkyl group or alkoxy group.].

16 Claims, No Drawings

POLYMER COMPOUND AND LIGHT EMITTING DEVICE USING THE SAME

TECHNICAL FIELD

The present invention relates to a polymer compound and a polymer light emitting device using the polymer compound.

BACKGROUND ART

High-molecular-weight light emitting materials are variously investigated since they are useful as a material to be used in a light emitting layer of a light emitting device and the like. Specifically, there are suggested a polyarylene composed of a benzothiadiazole derivative and spirofluorene (WO 03/020790) and a polyarylene composed of a benzothiadiazole derivative and fluorene (WO 00/046321, WO 02/059121).

However, these compounds have not been sufficient in bathochromaticity as a light emitting material in the red region.

DISCLOSURE OF THE INVENTION

An object of the present invention is to provide a polymer compound excellent in bathochromaticity and useful as a light emitting material in the red region, and a polymer light emitting device using the polymer compound.

The present invention provides a polymer compound comprising a repeating unit of the following formula (1):

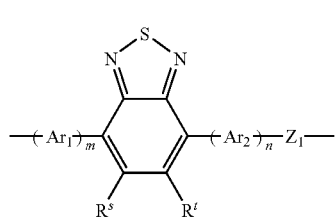

(1)

[wherein, $Ar_1$ and $Ar_2$ represent each independently an optionally substituted arylene group, optionally substituted divalent heterocyclic group or optionally substituted divalent aromatic amine group. When a plurality of $Ar_1$s and $Ar_2$s are present, these may be the same or different. $Z_1$ represents —$CR_1$=$CR_2$— or —C≡C—. Here, $R_1$ and $R_2$ represent each independently a hydrogen atom, alkyl group, aryl group, monovalent heterocyclic group or cyano group. m and n represent each independently 1 or 2. $R^s$ and $R^t$ represent each independently a hydrogen atom, alkyl group or alkoxy group.].
and having a polystyrene-reduced number average molecular weight of $1 \times 10^3$ to $1 \times 10^8$.

MODES FOR CARRYING OUT THE INVENTION

The present invention will be illustrated below. In this specification, when a vinylene site is present in a structure, the site may be a cis or trans structure.

<Polymer Compound>

The polymer compound of the present invention comprises a repeating unit of the above-described formula (1) and has a polystyrene-reduced number average molecular weight of $1 \times 10^3$ to $1 \times 10^8$, preferably $2 \times 10^3$ to $10^7$. The above-described repeating units may be contained singly or in combination of two or more.

Repeating Unit of the Formula (1)

In the above-described formula (1), the groups represented by $Ar_1$, $Ar_2$ optionally have a substituent. Examples of the substituent include an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, acyl group, acyloxy group, substituted carboxyl group, cyano group and the like. These substituents are the same as for explanations and examples of the group represented by R described later. When $Ar_1$, $Ar_2$ have a plurality of substituents, they may be the same or mutually different. $Ar_1$, $Ar_2$ represent preferably an optionally substituted arylene group or optionally substituted divalent heterocyclic group from the standpoint of elongation of light emission wavelength. It is preferable that at least one of the groups represented by $Ar_1$, $Ar_2$ has a substituent in the above-described formula (1) from the standpoint of enhancement of the solubility of a polymer compound of the present invention in a solvent.

In the above-described formula (1), the arylene group is a residual atom group after removal of two hydrogen atoms from an aromatic hydrocarbon and the carbon number thereof is usually about from 6 to 60. This carbon number does not include the carbon number of substituents. Here, the above-described aromatic hydrocarbon includes also those having a condensed ring and those having two or more benzene rings or condensed rings connected directly or via a group such as vinylene or the like. The arylene group optionally has a substituent.

Examples of the above-described arylene group include phenylene groups (e.g., the following formulae 1 to 3), naphthalenedinyl groups (the following formulae 4 to 13), anthracenylene groups (the following formulae 14 to 19), biphenylene groups (the following formulae 20 to 25), triphenylene groups (the following formulae 26 to 28), condensed ring compound groups (the following formulae 29 to 38), stilbene-diyl groups (the following formulae A to D), distilbene-diyl groups (the following formulae E, F), benzofluorene-diyl groups (the following formulae G, H, I, K) and the like. Of them, preferable are phenylene groups (the following formulae 1 to 3), naphthalenedinyl groups (the following formulae 4 to 13), biphenylene groups (the following formulae 20 to 25), fluorene-diyl groups (the following formulae 36 to 38), stilbene-diyl groups (the following formulae A to D), distilbene-diyl groups (the following formulae E, F) and benzofluorene-diyl groups (the following formulae G, H, I, K).

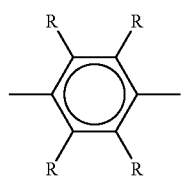

1

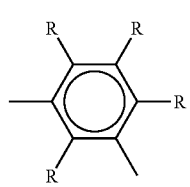

2

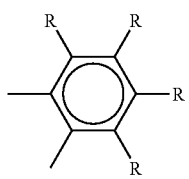
3
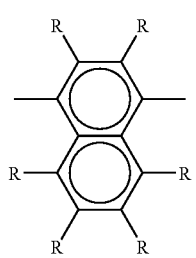
4
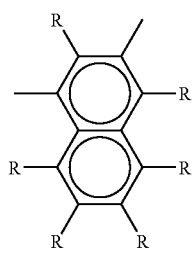
5
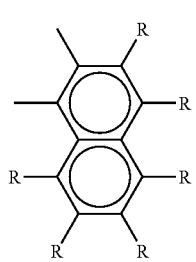
6
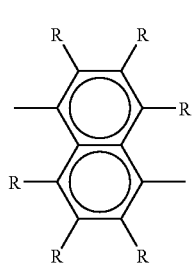
7
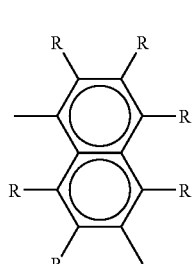
8
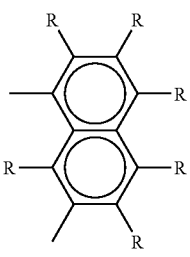
9
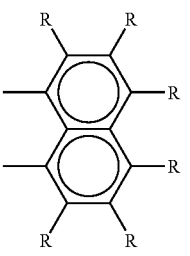
10
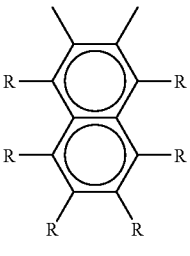
11
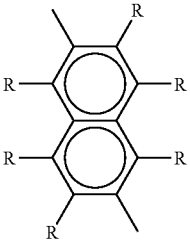
12
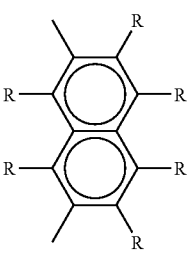
13
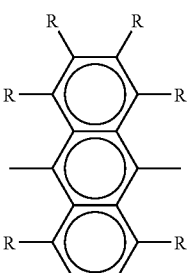
14

15
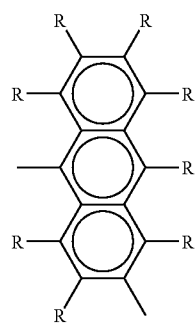
16
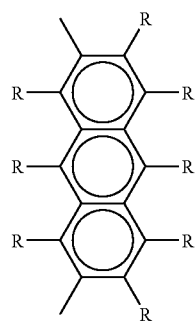
17
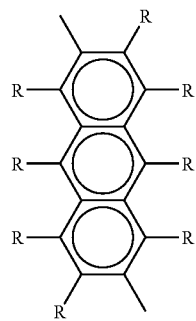
18
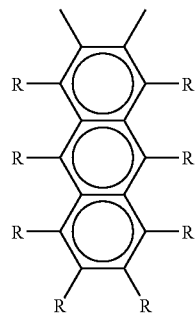
19
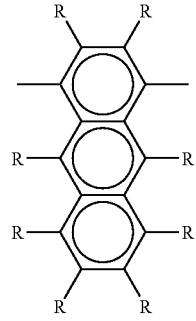
20
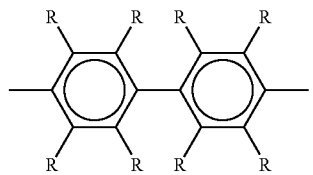
21
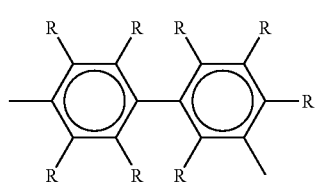
22
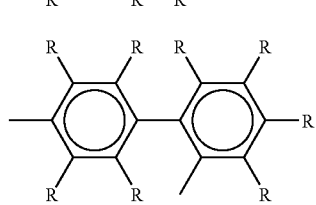
23
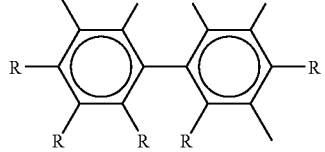
24
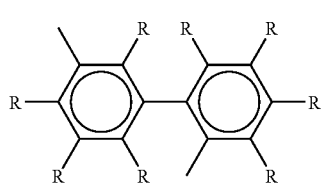
25
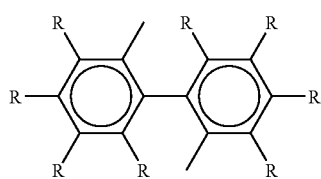
26
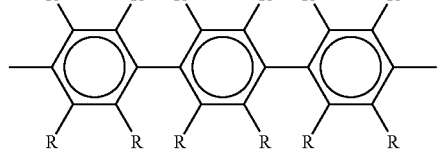
27
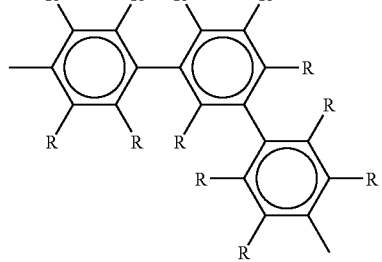

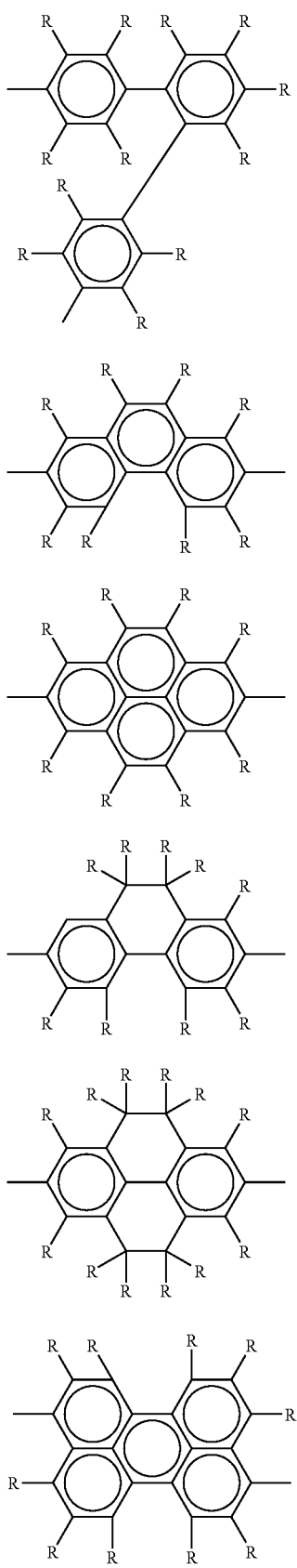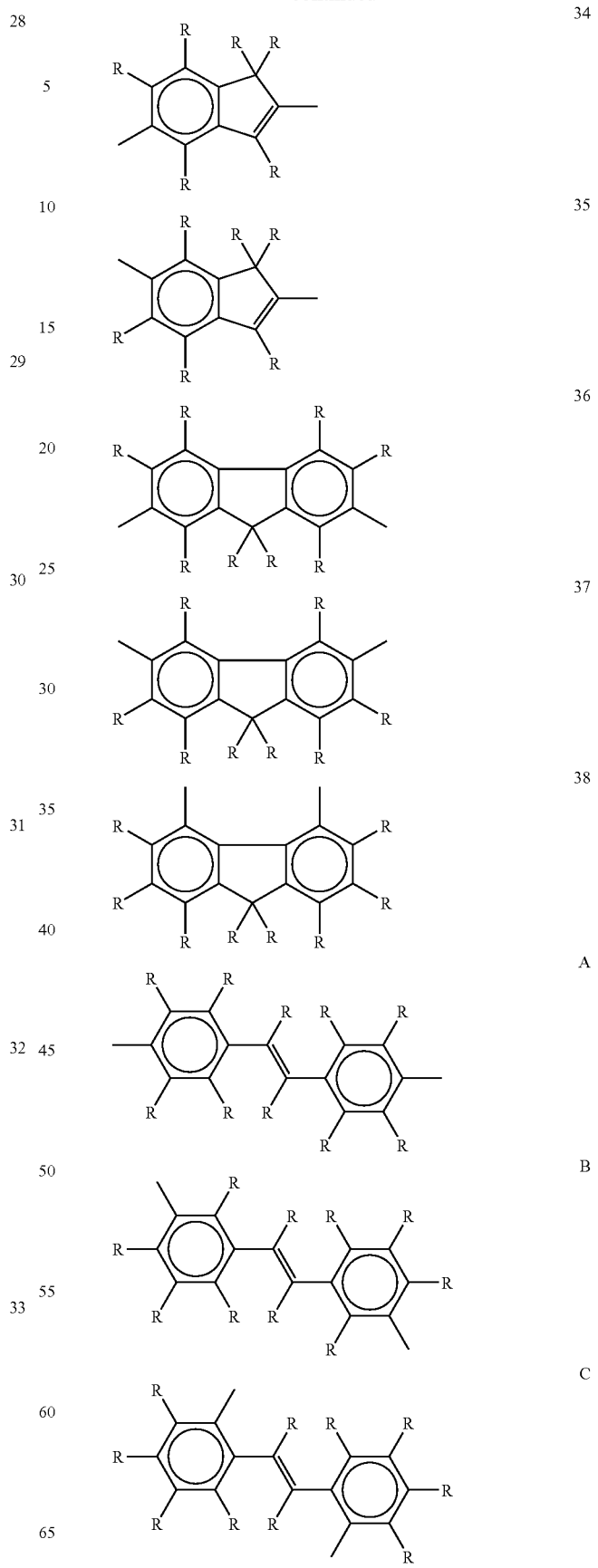

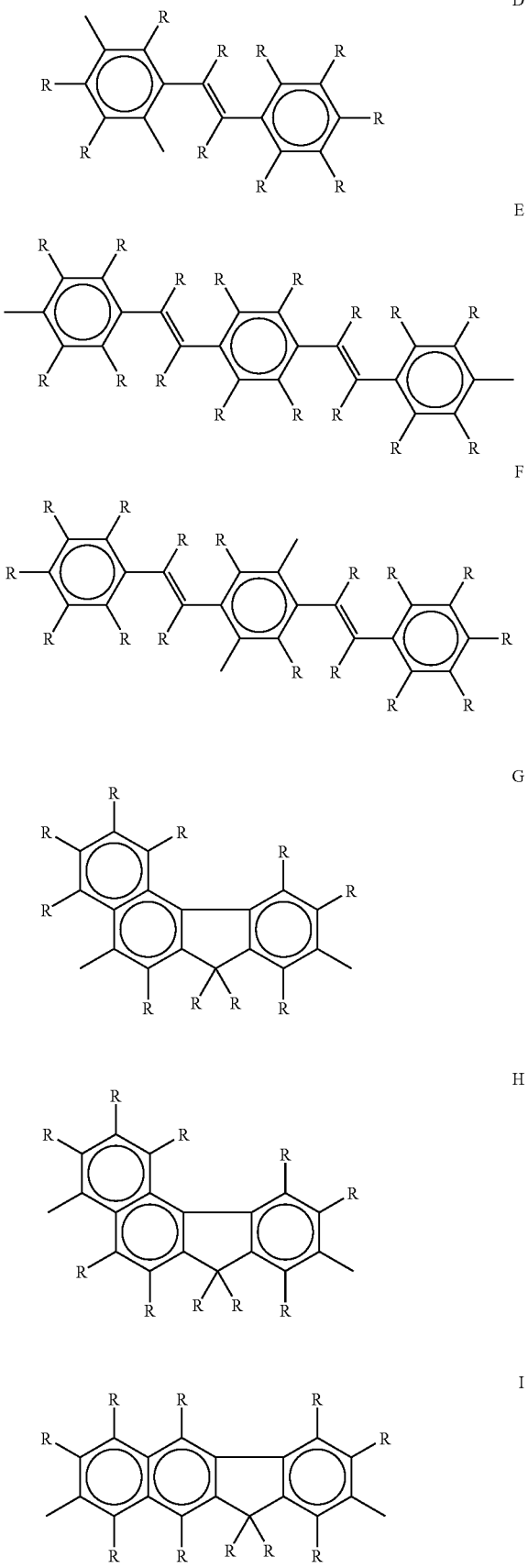
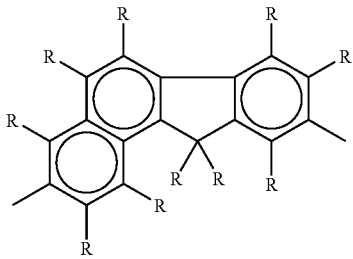

In the above-described formulae 1 to 38, A to I and K, Rs represent each independently a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, acyl group, acyloxy group, substituted carboxyl group or cyano group. In the above-described formulae, one structural formula has a plurality of Rs, and they may be the same or different. Further, two R2 may be mutually connected to form a ring.

The above-described alkyl group may be linear, branched or cyclic, or a combination thereof, and the carbon number thereof is usually about from 1 to 20. Specific examples of the above-described alkyl group include a methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, 3,7-dimethyloctyl group, lauryl group and the like, and preferable are a pentyl group, hexyl group, octyl group, 2-ethylhexyl group, decyl group and 3,7-dimethyloctyl group. Examples of non-linear alkyl groups include an isoamyl group, 2-ethylhexyl group, 3,7-dimethyloctyl group, cyclohexyl group, 4-$C_1$ to $C_{12}$ alkyl cyclohexyl groups ("$C_1$ to $C_{12}$ alkyl" means that the alkyl portion has a carbon number of 1 to 12, being applicable also in the following descriptions) and the like.

The above-described alkoxy group may be linear, branched or cyclic, and the carbon number thereof is usually about from 1 to 20. Specific examples of the above-described alkoxy group include a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group and the like, and preferable are a pentyloxy group, hexyloxy group, octyloxy group, 2-ethylhexyloxy group, decyloxy group and 3,7-dimethyloctyloxy group.

The above-described alkylthio group may be linear, branched or cyclic, and the carbon number thereof is usually about from 1 to 20. Specific examples of the above-described alkylthio group include a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group and the like, and preferable are a pentylthio group, hexylthio group, octylthio group, 2-ethylhexylthio group, decylthio group and 3,7-dimethyloctylthio group.

The above-described alkylsilyl group may be linear, branched or cyclic, and the carbon number thereof is usually about from 1 to 60. Specific examples of the above-described alkylsilyl group include a methylsilyl group, ethylsilyl group, propylsilyl group, i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group and the like, and preferable are a pentylsilyl group, hexylsilyl group, octylsilyl group, 2-ethylhexylsilyl group, decylsilyl group, 3,7-dimethyloctylsilyl group, pentyldimethylsilyl group, hexyldimethylsilyl group, octyldimethylsilyl group, 2-ethylhexyldimethylsilyl group, decyldimethylsilyl group and 3,7-dimethyloctyldimethylsilyl group.

The above-described alkylamino group may be linear, branched or cyclic and may be a monoalkylamino group or dialkylamino group, and the carbon number thereof is usually about from 1 to 40. Specific examples of the above-described alkylamino group include a methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group and the like, and preferable are a pentylamino group, hexylamino group, octylamino group, 2-ethylhexylamino group, decylamino group and 3,7-dimethyloctylamino group.

The above-described aryl group has a carbon number of usually about from 6 to 60. Specific examples of the above-described aryl group include an optionally substituted phenyl group, optionally substituted 1-naphthyl group, optionally substituted 2-naphthyl group and the like. The substituent of the above-described optionally substituted phenyl group includes an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, acyl group, acyloxy group, substituted carboxyl group, cyano group and the like. When a plurality of substituents are present, they may be the same or different. When the optionally substituted phenyl group has substituents, the number thereof is preferably 1 to 5, more preferably 1 to 3, particularly preferably 1.

When the above-described optionally substituted phenyl group has a substituent and this substituent is an alkyl group, preferable as the phenyl group having a substituent are phenyl groups having an alkyl group having 1 to 12 carbon atoms introduced as the substituent on the phenyl ring (hereinafter, referred to as "$C_1$ to $C_{12}$ alkylphenyl group". "$C_1$ to $C_{12}$ alkyl" means that the alkyl portion has a carbon number of 1 to 12, being applicable also in the following descriptions).

Examples of the $C_1$ to $C_{12}$ alkylphenyl group include a methyl-substituted phenyl group, ethyl-substituted phenyl group, propyl-substituted phenyl group, i-propyl-substituted phenyl group, butyl-substituted phenyl group, i-butyl-substituted phenyl group, t-butyl-substituted phenyl group, pentyl-substituted phenyl group, hexyl-substituted phenyl group, cyclohexyl-substituted phenyl group, heptyl-substituted phenyl group, octyl-substituted phenyl group, 2-ethylhexyl-substituted phenyl group, nonyl-substituted phenyl group, decyl-substituted phenyl group, 3,7-dimethyloctyl-substituted phenyl group, lauryl-substituted phenyl group, trifluoromethyl-substituted phenyl group, pentafluoroethyl-substituted phenyl group, perfluorobutyl-substituted phenyl group, perfluorohexyl-substituted phenyl group, perfluorooctyl-substituted phenyl group and the like, and of them, preferable from the standpoint of the solubility of a polymer compound in a solvent are a butyl-substituted phenyl group, i-butyl-substituted phenyl group, t-butyl-substituted phenyl group, hexyl-substituted phenyl group, heptyl-substituted phenyl group, octyl-substituted phenyl group, 2-ethylhexyl-substituted phenyl group, nonyl-substituted phenyl group, decyl-substituted phenyl group and 3,7-dimethyloctyl-substituted phenyl group. These $C_1$ to $C_{12}$ alkylphenyl groups optionally further have a substituent.

When the above-described optionally substituted phenyl group has a substituent and this substituent is an alkoxy group, preferable as the phenyl group having a substituent are phenyl groups having an alkoxy group having 1 to 12 carbon atoms introduced as the substituent on the phenyl ring (hereinafter, referred to as "$C_1$ to $C_{12}$ alkoxyphenyl group". "$C_1$ to $C_{12}$ alkoxy" means that the alkoxy portion has a carbon number of 1 to 12, being applicable also in the following descriptions).

Examples of the $C_1$ to $C_{12}$ alkoxyphenyl group include a methoxy-substituted phenyl group, ethoxy-substituted phenyl group, propyloxy-substituted phenyl group, i-propyloxy-substituted phenyl group, butoxy-substituted phenyl group, i-butoxy-substituted phenyl group, t-butoxy-substituted phenyl group, pentyloxy-substituted phenyl group, hexyloxy-substituted phenyl group, cyclohexyloxy-substituted phenyl group, heptyloxy-substituted phenyl group, octyloxy-substituted phenyl group, 2-ethylhexyloxy-substituted phenyl group, nonyloxy-substituted phenyl group, decyloxy-substituted phenyl group, 3,7-dimethyloctyloxy-substituted phenyl group, lauryloxy-substituted phenyl group, trifluoromethoxy-substituted phenyl group, pentafluoroethoxy-substituted phenyl group, perfluorobutoxy-substituted phenyl group, perfluorohexyloxy-substituted phenyl group, perfluorooctyloxy-substituted phenyl group, methoxymethyloxy-substituted phenyl group, 2-methoxyethyloxy-substituted phenyl group and the like, and of them, preferable from the standpoint of the solubility of a polymer compound in a solvent are a butoxy-substituted phenyl group, i-butoxy-substituted phenyl group, t-butoxy-substituted phenyl group, pentyloxy-substituted phenyl group, hexyloxy-substituted phenyl group, heptyloxy-substituted phenyl group, octyloxy-substituted phenyl group, 2-ethylhexyloxy-substituted phenyl group, nonyloxy-substituted phenyl group, decyloxy-substituted phenyl group, 3,7-dimethyloctyloxy-substituted phenyl group and lauryloxy-substituted phenyl group. These $C_1$ to $C_{12}$ alkoxyphenyl groups optionally further have a substituent.

When the above-described optionally substituted phenyl group has a substituent and this substituent is an acyl group, the phenyl group having a substituent includes phenyl groups substituted with an acyl group having 2 to 30, preferably 2 to 15 carbon atoms, and specifically, an acetyl-substituted phenyl group, propionyl-substituted phenyl group, butyryl-substituted phenyl group, isobutyryl-substituted phenyl group, pivaloyl-substituted phenyl group, trifluoroacetyl-substituted phenyl group and the like.

When the above-described optionally substituted phenyl group has a substituent and this substituent is an acyloxy group, the phenyl group having a substituent includes acyloxy groups having 2 to 30, preferably 2 to 15 carbon atoms, and specifically, an acetoxy-substituted phenyl group, propionyloxy-substituted phenyl group, butyryloxy-substituted phenyl group, isobutyryloxy-substituted phenyl group, pivaloyloxy-substituted phenyl group, trifluoroacetyloxy-substituted phenyl group and the like.

When the above-described optionally substituted phenyl group has a substituent and this substituent is a substituted carboxyl group, the phenyl group having a substituent includes phenyl groups having as a substituent a carboxyl group (the carbon number thereof is usually about from 2 to 30, preferably about 2 to 15) substituted with an alkyl group, aryl group, arylalkyl group or monovalent heterocyclic group, and preferable from the standpoint of easiness of synthesis are phenyl groups having as a substituent a carboxyl group substituted with an alkyl group. Specific examples of the phenyl group having a substituent include a methoxycarbonyl-substituted phenyl group, ethoxycarbonyl-substituted phenyl group, propoxycarbonyl-substituted phenyl group, i-propoxycarbonyl-substituted phenyl group, butoxycarbonyl-substituted phenyl group, i-butoxycarbonyl-substituted phenyl group, t-butoxycarbonyl-substituted phenyl group, pentyloxycarbonyl-substituted phenyl group, hexyloxycarbonyl-substituted phenyl group, cyclohexyloxycarbonyl-substituted phenyl group, heptyloxycarbonyl-substituted phenyl group, octyloxycarbonyl-substituted phenyl group, 2-ethylhexyloxycarbonyl-substituted phenyl group, nonyloxycarbonyl-substituted phenyl group, decyloxycarbonyl-substituted phenyl group, 3,7-dimethyloctyloxycarbonyl-substituted phenyl group, dodecyloxycarbonyl-substituted phenyl group, trifluoromethoxycarbonyl-substituted phenyl group, pentafluoroethoxycarbonyl-substituted phenyl group, perfluorobutoxycarbonyl-substituted phenyl group, perfluorohexyloxycarbonyl-substituted phenyl group, perfluorooctyloxycarbonyl-substituted phenyl group, phenoxycarbonyl-substituted phenyl group and the like.

The above-described aryloxy group has a carbon number of usually about from 6 to 60. Specific examples of the aryloxy group include a phenoxy group, $C_1$ to $C_{12}$ alkoxyphenoxy groups, $C_1$ to $C_{12}$ alkylphenoxy groups, 1-naphthyloxy group, 2-naphthyloxy group and the like, and $C_1$ to $C_{12}$ alkoxyphenoxy groups and $C_1$ to $C_{12}$ alkylphenoxy groups are preferable.

The above-described arylalkyl group has a carbon number of usually about from 7 to 60. Specific examples of the arylalkyl group include phenyl $C_1$ to $C_{12}$ alkyl groups, $C_1$ to $C_{12}$ alkoxyphenyl $C_1$ to $C_{12}$ alkyl groups, $C_1$ to $C_{12}$ alkylphenyl $C_1$ to $C_{12}$ alkyl groups, 1-naphthyl $C_1$ to $C_{12}$ alkyl groups, 2-naphthyl $C_1$ to $C_{12}$ alkyl groups and the like, and $C_1$ to $C_{12}$ alkoxyphenyl $C_1$ to $C_{12}$ alkyl groups and $C_1$ to $C_{12}$ alkylphenyl $C_1$ to $C_{12}$ alkyl groups are preferable.

The above-described arylalkoxy group has a carbon number of usually about from 7 to 60. Specific examples of the arylalkoxy group include phenyl $C_1$ to $C_{12}$ alkoxy groups, $C_1$ to $C_{12}$ alkoxyphenyl $C_1$ to $C_{12}$ alkoxy groups, $C_1$ to $C_{12}$ alkylphenyl $C_1$ to $C_{12}$ alkoxy groups, 1-naphthyl $C_1$ to $C_{12}$ alkoxy groups, 2-naphthyl $C_1$ to $C_{12}$ alkoxy groups and the like, and $C_1$ to $C_{12}$ alkoxyphenyl $C_1$ to $C_{12}$ alkoxy groups and $C_1$ to $C_{12}$ alkylphenyl $C_1$ to $C_{12}$ alkoxy groups are preferable.

The above-described arylalkenyl group has a carbon number of usually about from 8 to 60. Specific examples of the arylalkenyl group include phenyl $C_2$ to $C_{12}$ alkenyl groups ("$C_2$ to $C_{12}$ alkenyl" means that the alkenyl portion has a carbon number of 2 to 12, being applicable also in the following descriptions), $C_1$ to $C_{12}$ alkoxyphenyl $C_2$ to $C_{12}$ alkenyl groups, $C_1$ to $C_{12}$ alkylphenyl $C_2$ to $C_{12}$ alkenyl groups, 1-naphthyl $C_2$ to $C_{12}$ alkenyl groups, 2-naphthyl $C_2$ to $C_{12}$ alkenyl groups and the like, and $C_1$ to $C_{12}$ alkoxyphenyl $C_2$ to $C_{12}$ alkenyl groups and $C_1$ to $C_{12}$ alkylphenyl $C_2$ to $C_{12}$ alkenyl groups are preferable.

The above-described arylalkynyl group has a carbon number of usually about from 8 to 60. Specific examples of the arylalkynyl group include phenyl $C_2$ to $C_{12}$ alkynyl groups, $C_1$ to $C_{12}$ alkoxyphenyl $C_2$ to $C_{12}$ alkynyl groups, $C_1$ to $C_{12}$ alkylphenyl $C_2$ to $C_{12}$ alkynyl groups, 1-naphthyl $C_2$ to $C_{12}$ alkynyl groups, 2-naphthyl $C_2$ to $C_{12}$ alkynyl groups and the like, and $C_1$ to $C_{12}$ alkoxyphenyl $C_2$ to $C_{12}$ alkynyl groups and $C_1$ to $C_{12}$ alkylphenyl $C_2$ to $C_{12}$ alkynyl groups are preferable.

The above-described arylamino group has a carbon number of usually about from 6 to 60. Specific examples of the arylamino group include a phenylamino group, diphenylamino group, $C_1$ to $C_{12}$ alkoxyphenylamino groups, di($C_1$ to $C_{12}$ alkoxyphenyl)amino groups, di($C_1$ to $C_{12}$ alkylphenyl) amino groups, 1-naphthylamino group, 2-naphthylamino group and the like, and $C_1$ to $C_{12}$ alkylphenylamino groups and di($C_1$ to $C_{12}$ alkylphenyl)amino groups are preferable.

The above-described acyl group has a carbon number of usually about from 2 to 30, preferably about from 2 to 15. Specific examples of the acyl group include an acetyl group, propionyl group, butyryl group, isobutyryl group, pivaloyl group, benzoyl group, trifluoroacetyl group, pentafluorobenzoyl group and the like.

The above-described acyloxy group has a carbon number of usually about from 2 to 30, preferably about 2 to 15. Specific examples of the acyloxy group include an acetoxy group, propionyloxy group, butyryloxy group, isobutyryloxy group, pivaloyloxy group, benzoyloxy group, trifluoroacetyloxy group, pentafluorobenzyloxy group and the like.

The above-described substituted carboxyl group include carboxyl groups substituted with an alkyl group, aryl group, arylalkyl group or monovalent heterocyclic group, and has a carbon number of usually about from 2 to 30, preferably about 2 to 15. Specific examples of the substituted carboxyl group include a methoxycarbonyl group, ethoxycarbonyl group, propoxycarbonyl group, i-propoxycarbonyl group, butoxycarbonyl group, i-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, pyridyloxycarbonyl group and the like. These groups optionally have a substituent. The carbon number of the substituted carboxyl group does not include the carbon number of the substituents.

The monovalent heterocyclic group is a residual atom group after removal of one hydrogen atom from a heterocyclic compound. The monovalent heterocyclic group has a carbon number of usually about from 4 to 60, and specifically, includes a thienyl group, $C_1$ to $C_{12}$ alkylthienyl groups, pyrrolyl group, furyl group, pyridyl group, $C_1$ to $C_{12}$ alkylpyridyl groups and the like, and a thienyl group, $C_1$ to $C_{12}$ alkylthienyl groups, pyridyl group and $C_1$ to $C_{12}$ alkylpyridyl groups are preferable.

When the above-described substituent is a group containing an alkyl chain, the alkyl chain may be interrupted by a heteroatom or a group containing a hetero atom. The heteroatom includes an oxygen atom, sulfur atom, nitrogen atom and the like. The heteroatom or the group containing a heteroatom, for example, includes the following groups.

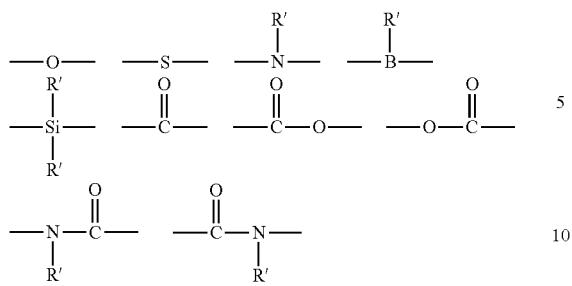

(wherein, R' represents a hydrogen atom, alkyl group having 1 to 20 carbon atoms, aryl group having 6 to 60 carbon atoms or monovalent heterocyclic group having 4 to 60 carbon atoms. When a plurality of R's are present, they may be the same or different.).

The alkyl group, aryl group and monovalent heterocyclic group represented by R' in the above-described formulae are the same as those explained and illustrated for the above-described substituent represented by R.

In the above-described formula (1), the divalent heterocyclic group is a residual atom group after removal of two hydrogen atoms from a heterocyclic compound and the carbon number thereof is usually about from 4 to 60. This carbon number does not include the carbon number of substituents. The above-described heterocyclic compound includes organic compounds having a cyclic structure in which elements constituting the ring include not only a carbon atom but also heteroatoms such as oxygen, sulfur, nitrogen, phosphorus, boron and the like contained in the ring. As the divalent heterocyclic group, divalent aromatic heterocyclic groups are preferable. The divalent heterocyclic group optionally has a substituent.

Examples of the divalent heterocyclic group include the following groups.

Groups containing nitrogen as a heteroatom; pyridinediyl groups (the following formulae 39 to 44), diazaphenylene groups (the following formulae 45 to 48), quinolinediyl groups (the following formulae 49 to 63), quinoxalinediyl groups (the following formulae 64 to 68), acridinediyl groups (the following formulae 69 to 72), bipyridyldiyl groups (the following formulae 73 to 75), phenanthrolinediyl groups (the following formulae 76 to 78) and the like.

Groups containing silicon, nitrogen, oxygen, sulfur, selenium and the like as a heteroatom and having a fluorene structure (the following formulae 79 to 93).

5-membered ring heterocyclic groups containing silicon, nitrogen, oxygen, sulfur, selenium and the like as a hetero atom (the following formulae 94 to 98).

5-membered ring condensed heterocyclic groups containing silicon, nitrogen, oxygen, sulfur, selenium and the like as a heteroatom (the following formulae 99 to 108).

5-membered ring heterocyclic groups containing sulfur and the like as a heteroatom, connecting at an α-position of the heteroatom to form a dimer or oligomer (the following formulae 109 to 110).

5-membered ring heterocyclic groups containing silicon, nitrogen, oxygen, sulfur, selenium and the like as a hetero atom, connecting at an α-position of the heteroatom to a phenyl group (the following formulae 111 to 117).

phenoxadine group (the following formula L), phenothiadine group (the following formula M).

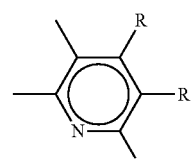

39

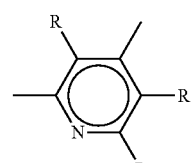

40

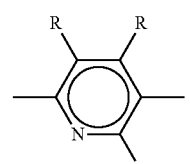

41

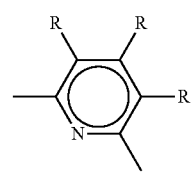

42

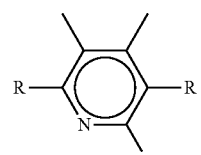

43

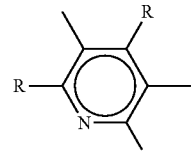

44

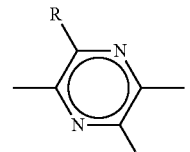

45

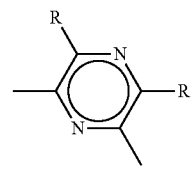

46

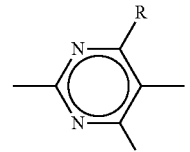

47

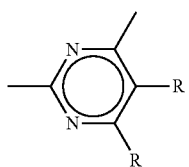
48
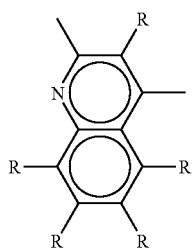
49
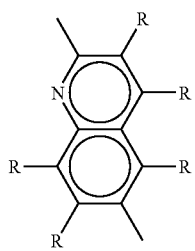
50
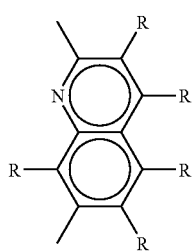
51
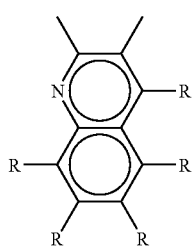
52
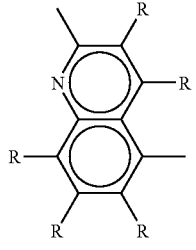
53
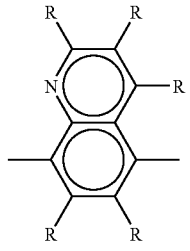
54
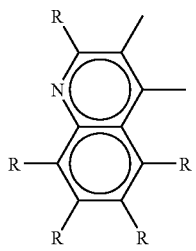
55
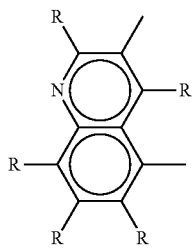
56
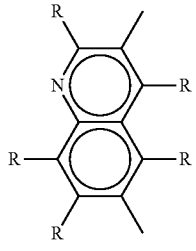
57
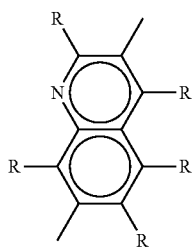
58
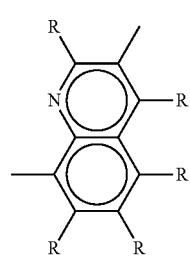
59

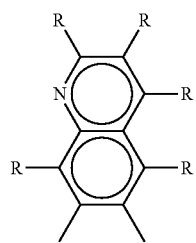
60
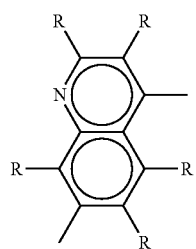
61
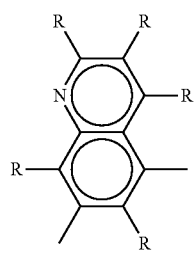
62
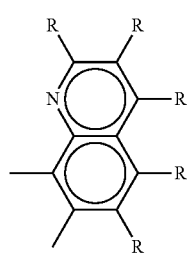
63
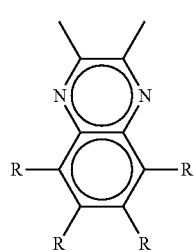
64
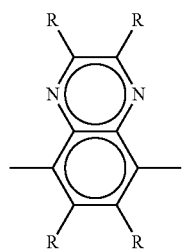
65
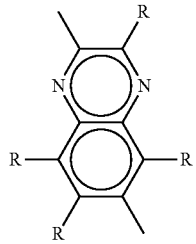
66
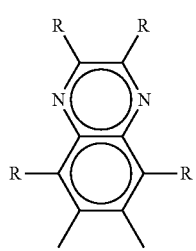
67
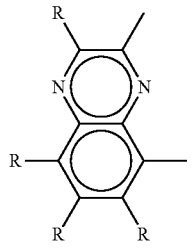
68
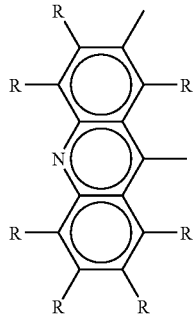
69
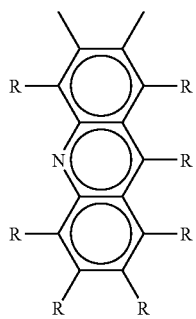
70

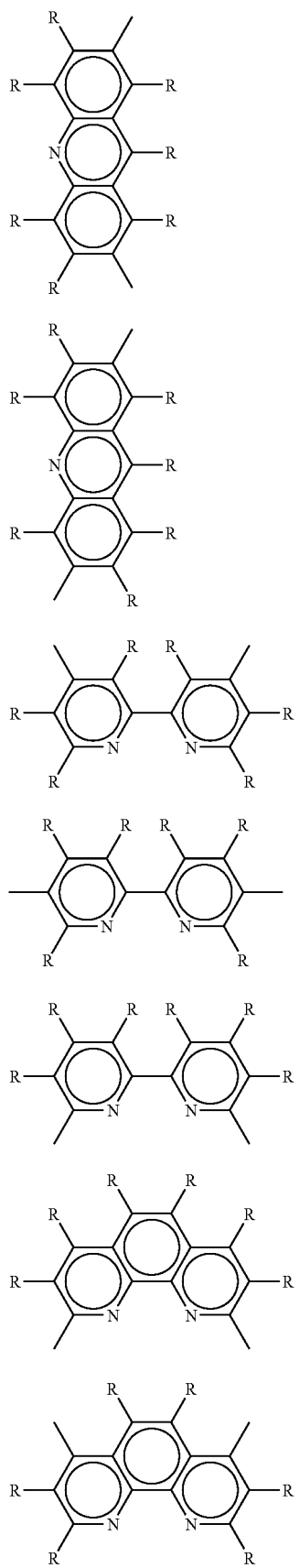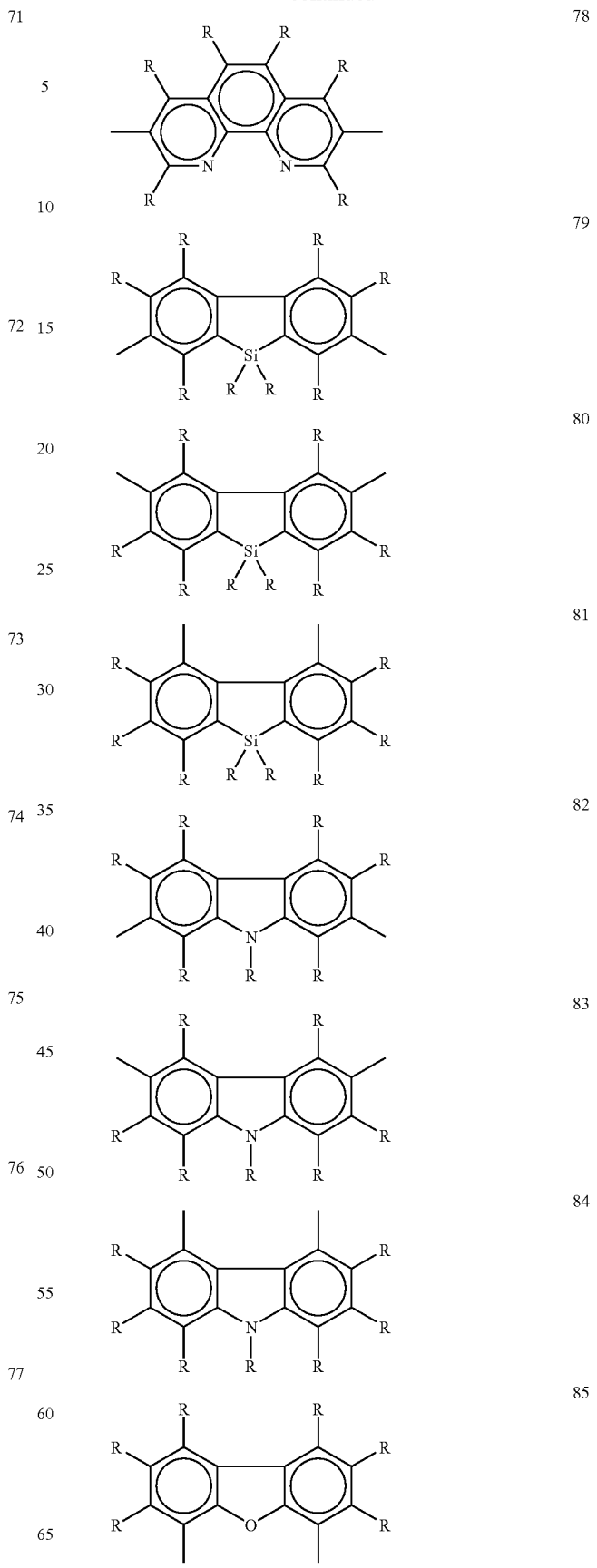

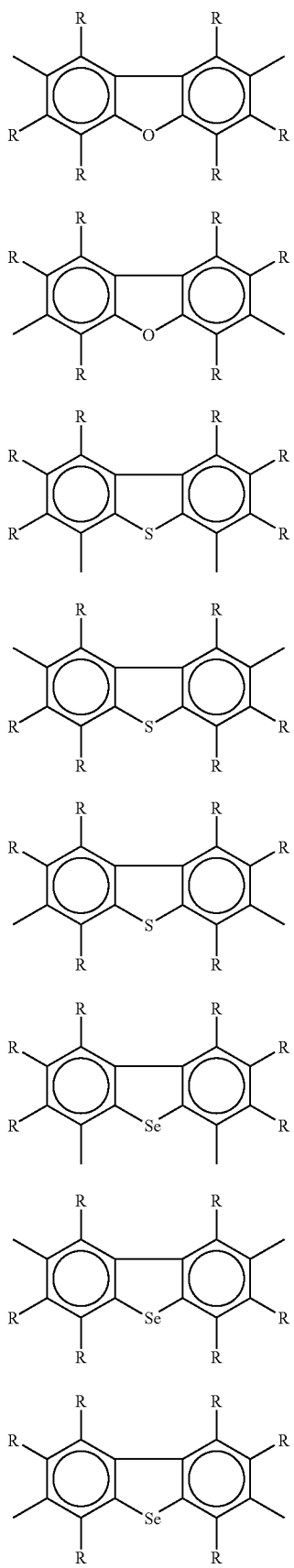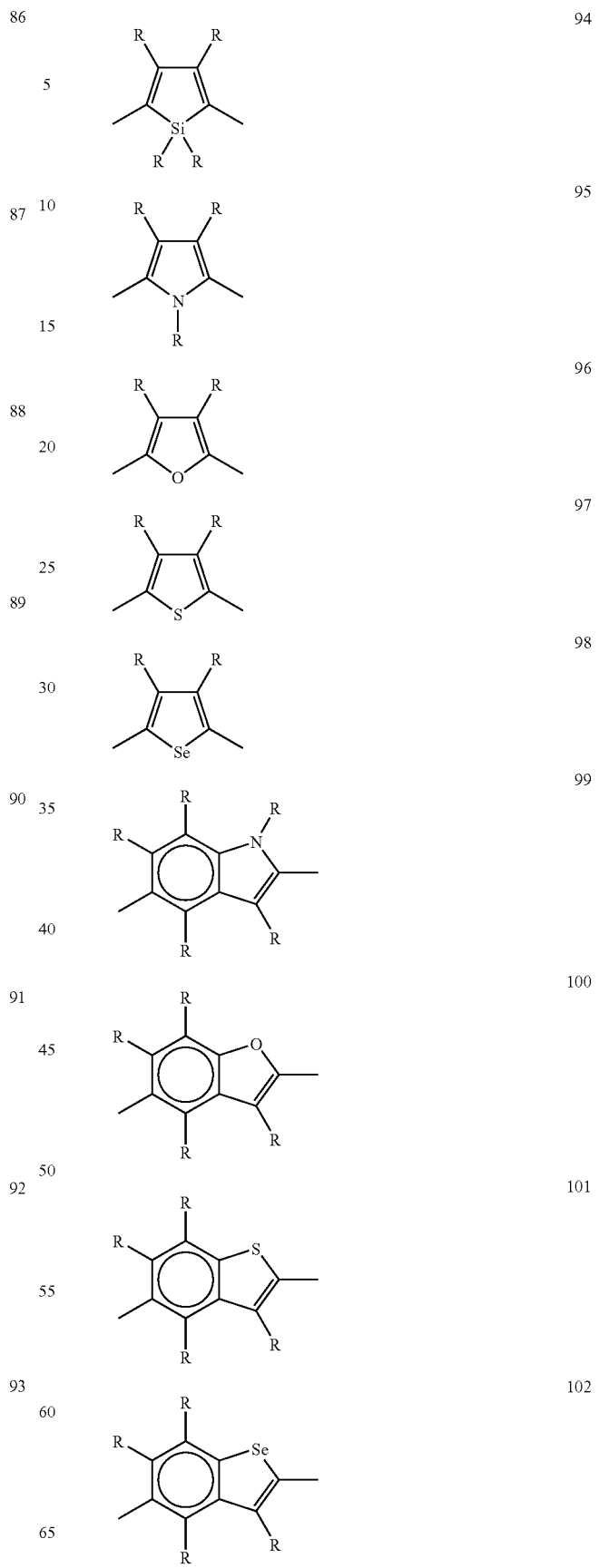

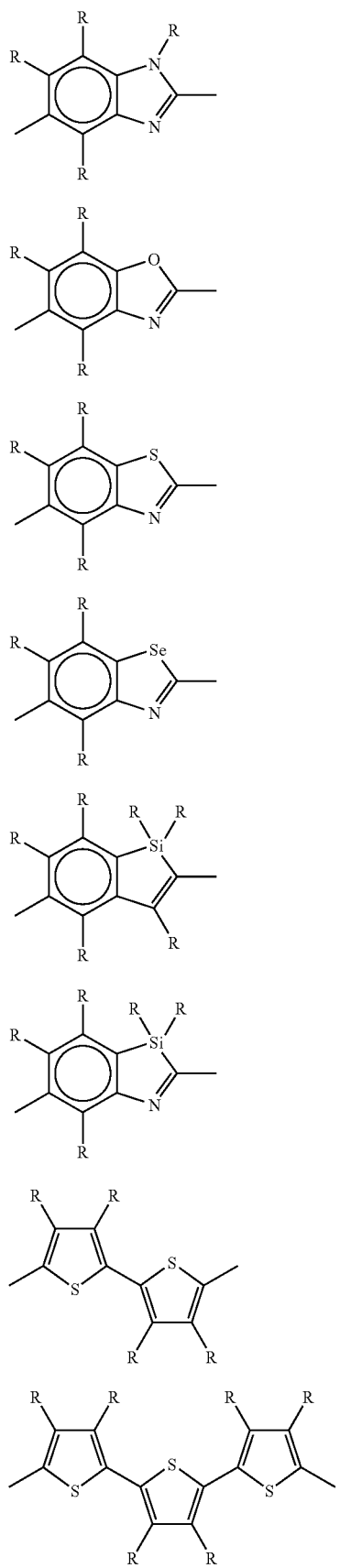
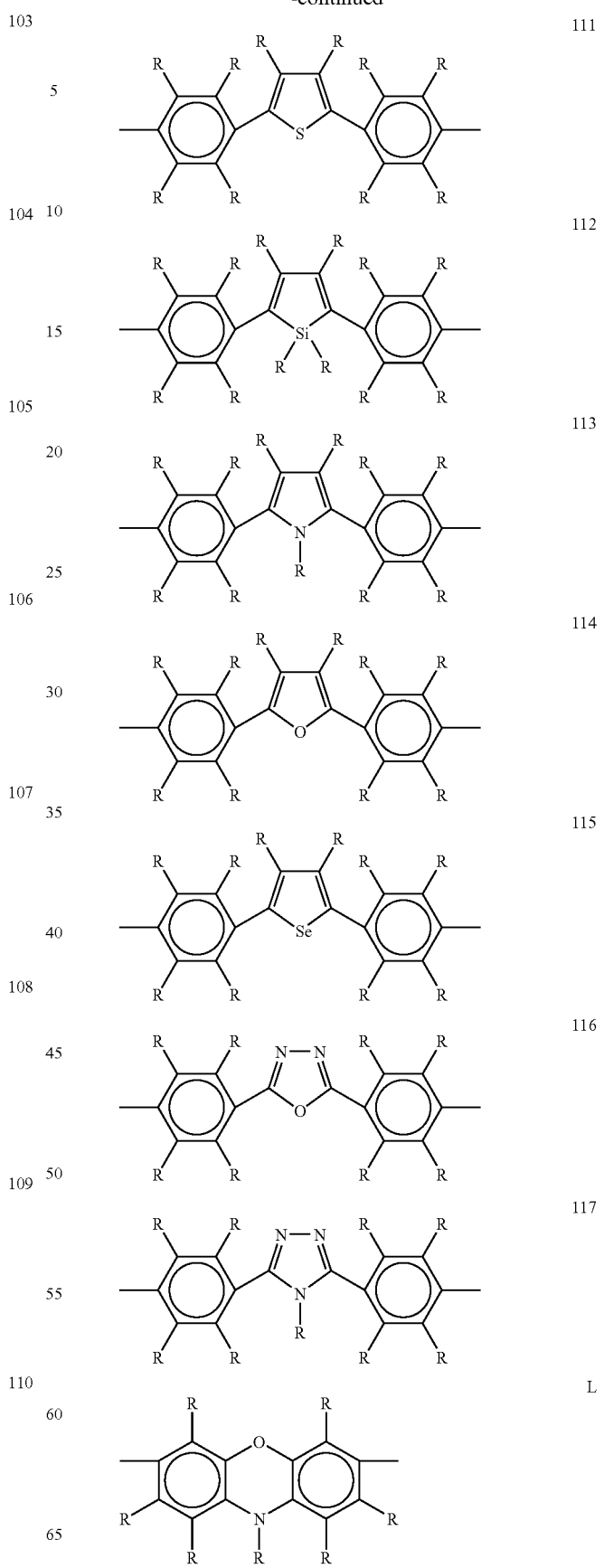

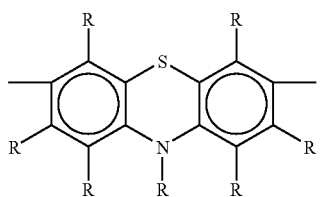

In the above-described formulae 39 to 117, L and M, R represents the same meaning as described above.

In the above-described formula (1), the divalent aromatic amine group is a residual atom group after removal of two hydrogen atoms from an aromatic amine and the carbon number thereof is usually about from 4 to 60. The divalent aromatic amine optionally has a substituent; and the above-described carbon number does not include the carbon number of substituents. The divalent aromatic amine group, for example, includes groups of the following general formula (3).

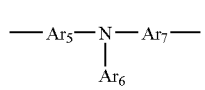

(3)

(wherein, $Ar_5$ and $Ar_7$ represent each independently an optionally substituted arylene group, group of the general formula (4) or group of the general formula (5). $Ar_6$ represents an optionally substituted aryl group, group of the general formula (6) or group of the general formula (7). A ring may be formed between $Ar_5$ and $Ar_6$, $Ar_5$ and $Ar_7$, or $Ar_6$ and $Ar_7$.

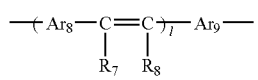

(4)

(wherein, $Ar_8$ and $Ar_9$ represent each independently an optionally substituted arylene group. $R_7$ and $R_8$ represent each independently a hydrogen atom, alkyl group, aryl group, monovalent heterocyclic group or cyano group. l represents 0 or 1.).

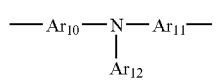

(5)

(wherein, $Ar_{10}$ and $Ar_{11}$ represent each independently an optionally substituted arylene group. $Ar_{12}$ represents an optionally substituted aryl group. A ring may be formed between $Ar_{10}$ and $Ar_{12}$, $Ar_{10}$ and $Ar_{11}$, or $Ar_{11}$ and $Ar_{12}$.).

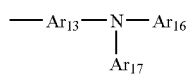

(6)

(wherein, $Ar_{13}$ represents an optionally substituted arylene group. $Ar_{16}$ and $Ar_{17}$ represent each independently an optionally substituted aryl group. A ring may be formed between $Ar_{13}$ and $Ar_{16}$, $Ar_{13}$ and $Ar_{17}$, or $Ar_{16}$ and $Ar_{17}$.).

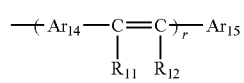

(7)

(wherein, $Ar_{14}$ represents an optionally substituted arylene group. $Ar_{15}$ represents an optionally substituted aryl group. $R_{11}$ and $R_{12}$ represent each independently a hydrogen atom, alkyl group, aryl group, monovalent heterocyclic group or cyano group. r represents 0 or 1.).

The arylene group represented by $Ar_5$, $Ar_7$, $Ar_8$, $Ar_9$, $Ar_{10}$, $Ar_{11}$, $Ar_{13}$, $Ar_{14}$ in the above-described formulae has a carbon number of usually about 6 to 60, and specific examples thereof include a phenylene group, naphthalenediyl group, anthracene-diyl group, biphenylene group, triphenylene group, fluorene-diyl group, stilbene-diyl group and the like. A phenylene group is preferable from the standpoint of easiness of synthesis of a polymer compound.

The aryl group represented by $Ar_6$, $Ar_{12}$, $Ar_{15}$, $Ar_{16}$, $Ar_{17}$ in the above-described formulae has a carbon number of usually 6 to 60, and specific examples thereof include a phenyl group, $C_1$ to $C_{12}$ alkoxyphenyl groups, $C_1$ to $C_{12}$ alkylphenyl groups, 1-naphthyl group, 2-naphthyl group and the like. A phenyl group is preferable from the standpoint of easiness of synthesis of a polymer compound.

The alkyl group, aryl group and monovalent heterocyclic group represented by $R_7$, $R_8$, $R_{11}$, $R_{12}$ in the above-described formulae are the same as those explained and illustrated as the above-described substituent represented by R.

$Ar_5$ to $Ar_{17}$ in the above-described formulae optionally have a substituent such as an alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, acyl group, acyloxy group, substituted carboxyl group, cyano group or the like.

The divalent aromatic amine group includes specifically, the following groups.

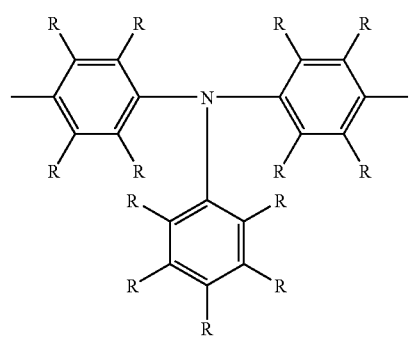

118

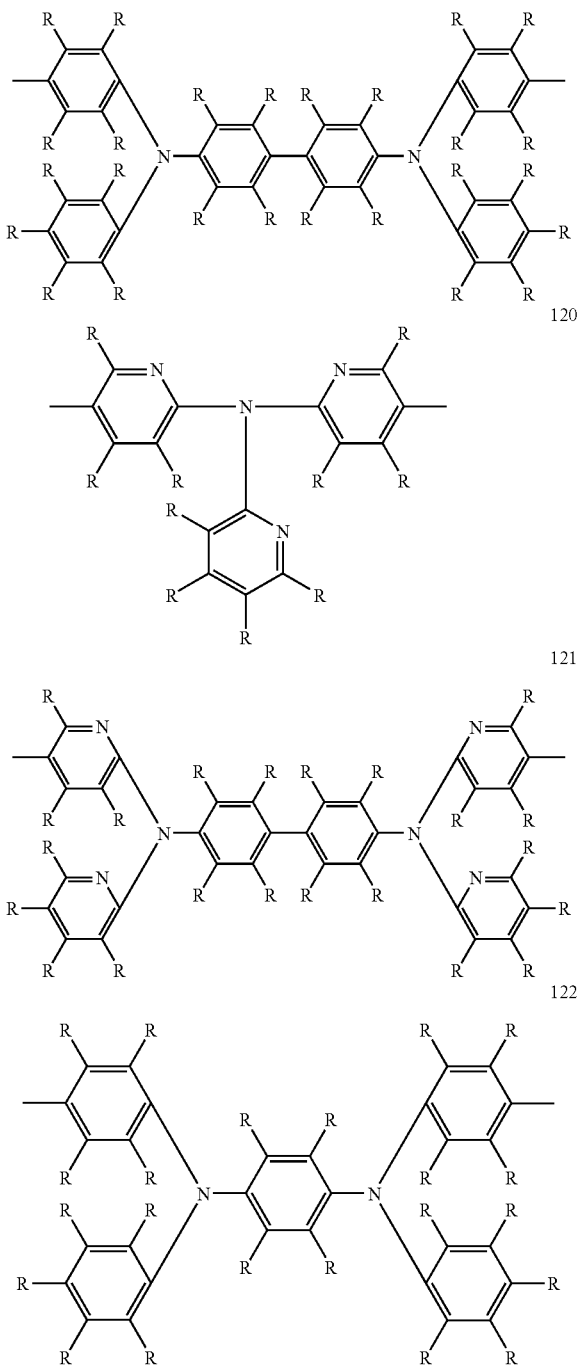

(in the above-described formulae 118 to 122, R represents the same meaning as described above.).

In the above-described formula (1), $Z_1$ represents —$CR_1$=$CR_2$— or —C≡C—, and —$CR_1$=$CR_2$— is preferable from the standpoint of oxidation stability. Here, $R_1$, $R_2$ represent each independently a hydrogen atom, alkyl group, aryl group, monovalent heterocyclic group or cyano group, and preferable from the standpoint of easiness of synthesis of a polymer compound are a hydrogen atom, alkyl group and aryl group.

The alkyl group represented by $R_1$, $R_2$ means the same meaning as explained for R.

The aryl group represented by $R_1$, $R_2$ has a carbon number of usually about from 6 to 60. Specific examples thereof include a phenyl group, $C_1$ to $C_{12}$ alkoxyphenyl groups, $C_1$ to $C_{12}$ alkylphenyl groups, 1-naphthyl group, 2-naphthyl group, anthracenyl group, biphenyl group, triphenyl group, pyrenyl group and the like, and preferable from the standpoint of easiness of synthesis of a polymer compound are a phenyl group, $C_1$ to $C_{12}$ alkoxyphenyl groups, $C_1$ to $C_{12}$ alkylphenyl groups, naphthyl group and biphenyl group, and a phenyl group is more preferable.

The monovalent heterocyclic group represented by $R_1$, $R_2$ is a residual atom group after removal of one hydrogen atom from a heterocyclic compound, and the carbon number thereof is usually about from 2 to 60. Specific examples thereof include the following groups.

Monovalent heterocyclic groups containing nitrogen as a heteroatom; pyridinyl group, diazaphenyl group, quinolinyl group, quinoxalinyl group, acridinyl group, bipyridinyl group, phenanthroline-yl group and the like.

Groups containing silicon, nitrogen, oxygen, sulfur, selenium and the like as a heteroatom and having a fluorene structure (the above-described formulae 79 to 93 in which one of connecting bonds is a substituent R).

5-membered ring heterocyclic groups containing silicon, nitrogen, oxygen, sulfur, selenium and the like as a hetero atom (the above-described formulae 94 to 98 in which one of connecting bonds is a substituent R).

5-membered ring condensed heterocyclic groups containing silicon, nitrogen, oxygen, sulfur, selenium and the like as a heteroatom (the above-described formulae 99 to 108 in which one of connecting bonds is a substituent R).

5-membered ring heterocyclic groups containing sulfur and the like as a heteroatom, connecting at an α-position of the heteroatom to form a dimer or oligomer (the above-described formulae 109 to 110 in which one of connecting bonds is a substituent R).

5-membered ring heterocyclic groups containing silicon, nitrogen, oxygen, sulfur, selenium and the like as a hetero atom, connecting at an α-position of the heteroatom to a phenyl group (the above-described formulae 111 to 117 in which one of connecting bonds is a substituent R).

In the above-described formula (1), m and n represent each independently 1 or 2. It is preferable that m and n are identical from the standpoint of easiness of synthesis of a monomer.

In the above-described formula (1), the alkyl group and alkoxy group represented by $R^s$ and $R^t$ are the same as those explained and illustrated as the group represented by R. From the standpoint of easiness of synthesis of a monomer, $R^s$ and $R^t$ represent preferably a hydrogen atom or alkyl group, further preferably a hydrogen atom.

The above-described repeating unit of the formula (1) is preferably a unit of the following formula (1a):

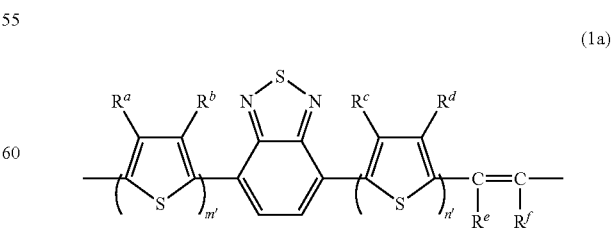

(1a)

[wherein, $R^a$, $R^b$, $R^c$ and $R^d$ represent each independently a hydrogen atom, alkyl group, alkoxy group or aryl group. $R^e$ and $R^f$ represent each independently a hydrogen atom, alkyl group or aryl group. m' and n' represent each independently 1 or 2. When a plurality of $R^a$s to $R^d$s are present, they may be the same or different.).
from the standpoint of the solubility of a polymer compound and elongation of fluorescence wavelength.

The alkyl group and aryl group represented by $R^a$, $R^b$, $R^c$, $R^d$, $R^e$ and $R^f$ and the alkoxy group represented by $R^a$, $R^b$, $R^c$ and $R^d$, in the above-described formula (1a), are the same as those explained and illustrated as R.

In the above-described formula (1a), $R^a$, $R^b$, $R^c$ and $R^d$ represent preferably a hydrogen atom, alkyl group or aryl group, and it is preferable that one or more of them represent an alkyl group from the standpoint of the solubility of a polymer compound. It is preferable that at least one of $R^e$ and $R^f$ represents an alkyl group or aryl group from the standpoint of the solubility of a polymer compound.

Specific examples of the above-described repeating unit of the formula (1) include units of the following formulae.

In the above-described formulae, Rs represent each independently the same meaning as described above. A plurality of Rs are present in one structural formula, and they may be the same or different.

Repeating Unit of the Formula (2)

As the polymer compound of the present invention, those further containing a repeating unit of the following formula (2):

$$—Ar_5—Z_2—\qquad(2)$$

[wherein, $Ar_5$ represents an optionally substituted arylene group, optionally substituted divalent heterocyclic group or optionally substituted divalent aromatic amine group. $Z_2$ represents $—CR_3=CR_4—$ or $—C\equiv C—$. $R_3$ and $R_4$ represent each independently a hydrogen atom, alkyl group, aryl group, monovalent heterocyclic group or cyano group.]

in addition to the above-described repeating unit of the formula (1) are preferable from the standpoint of the solubility of a polymer compound and film formability thereof.

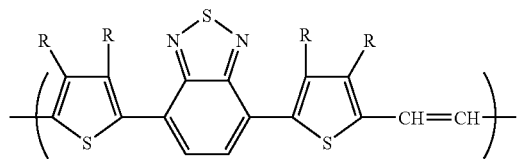

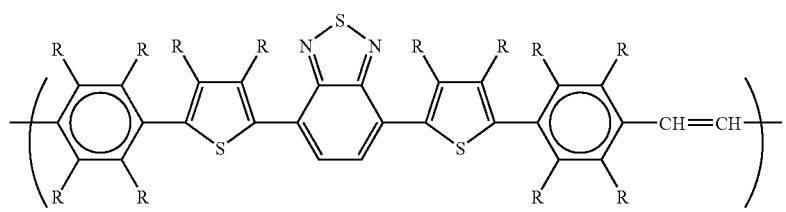

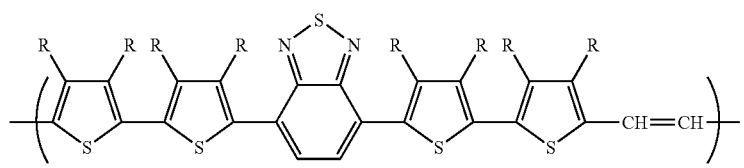

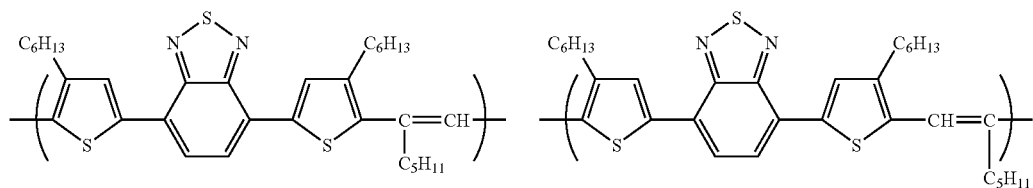

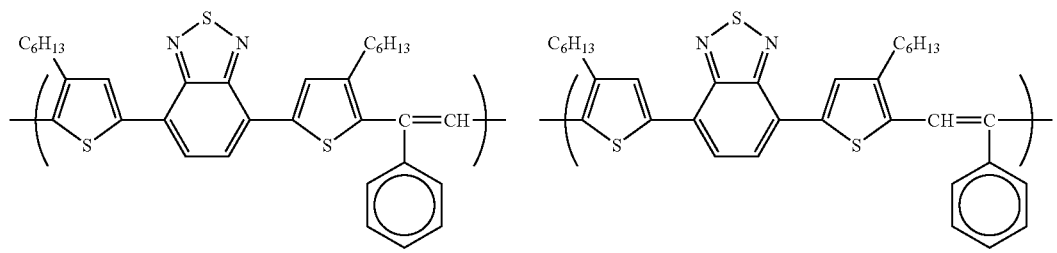

In the above-described formula (2), the group represented by Ar₅ is preferably an optionally substituted arylene group or optionally substituted divalent heterocyclic group from the standpoint of fluorescence intensity. The group represented by Ar₅ denotes the same groups as explained and illustrated as the above-described group represented by Ar₁, Ar₂.

In the above-described formula (2), the optionally substituted arylene group represented by Ar₅ is preferably a group of the following formula (60):

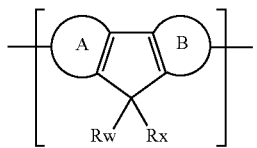

(60)

[wherein, A ring and B ring represent each independently an optionally substituted aromatic hydrocarbon ring. Two connecting bonds are present respectively on A ring or B ring. Rw and Rx represent each independently a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, acyl group, substituted carboxyl group or cyano group, and Rw and Rx may be mutually connected to form a ring.] from the standpoint of the solubility of a polymer compound and fluorescence intensity thereof.

In the above-described formula (60), the alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, acyl group and substituted carboxyl group are the same as those explained and illustrated as R in the above-described formulae 1 to 38, A to I, and K.

In the above-described formula (60), $R_w$ and $R_x$ preferably represent the same group from the standpoint of easiness of synthesis of a monomer.

As the above-described optionally substituted arylene group represented by the formula (60), those in which one of two connecting bonds is present on A ring and another group is present on B ring are preferable from the standpoint of easiness of synthesis of a monomer. From the standpoint of heat resistance, it is preferable that at least one of A ring and B ring is an aromatic hydrocarbon ring obtained by condensation of several benzene rings.

As the above-described aromatic hydrocarbon ring, a benzene ring or a ring obtained by condensation of several benzene rings is preferable. Specifically, aromatic hydrocarbon rings such as, for example, a benzene ring, naphthalene ring, anthracene ring, tetracene ring, pentacene ring, pyrene ring, phenanthrene ring and the like are mentioned, and from the standpoint of easiness of synthesis of a monomer, preferable are a benzene ring, naphthalene ring, anthracene ring and phenanthrene ring, and further preferable are a benzene ring and naphthalene ring.

As the combination of A ring and B ring, preferably mentioned are benzene ring and benzene ring, benzene ring and naphthalene ring, benzene ring and anthracene ring, benzene ring and phenanthrene ring, naphthalene ring and anthracene ring, naphthalene ring and phenanthrene ring, anthracene ring and phenanthrene ring, and the like, and more preferable are benzene ring and benzene ring, and benzene ring and naphthalene ring, from the standpoint of easiness of synthesis of a monomer.

The above-described optionally substituted arylene group of the formula (60) is preferably a group of the following formulae (2A) to (2D):

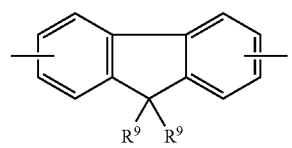

(2A)

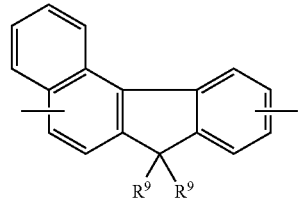

(2B)

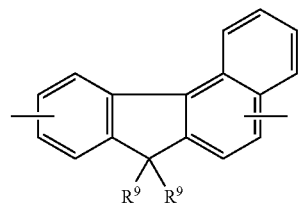

(2C)

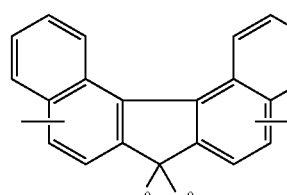

(2D)

[wherein, $R^g$ represents a hydrogen atom, alkyl group or aryl group. Two $R^g$s may be the same or different. Two $R^g$ may be mutually connected to form a ring.] from the standpoint of easiness of synthesis of a monomer and the fluorescence intensity of a polymer compound.

In the above-described formulae (2A) to (2D), $R^g$ preferably represents an alkyl group from the standpoint of the solubility of a polymer compound. The alkyl group and aryl group represented by $R^g$ are the same as those explained and illustrated as the above-described group represented by $R^a$ to $R^f$.

As the above-described optionally substituted arylene group, preferable are phenylene groups (the above-described formulae 1 to 3), naphthalenedinyl groups (the above-described formulae 4 to 13), biphenylene groups (the above-described formulae 20 to 25), fluorene-diyl groups (the above-described formulae 36 to 38), stilbene-diyl groups (the above-described formulae A to D), distilbene-diyl groups (the above-described formulae E, F), benzofluorene-diyl groups (the above-described formulae G, H, I, K) and the like, including those of the above-described formula (60) and the above-described formulae (2A) to (2D), from the standpoint of easiness of synthesis of a monomer and the fluorescence intensity of a polymer compound.

In the above-described formula (2), the optionally substituted divalent heterocyclic group represented by Ar₅ is preferably a group of the following formula (70):

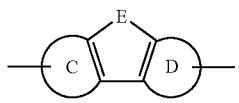
(70)

[wherein, C ring and D ring represent each independently an aromatic ring. The C ring and D ring optionally have a substituent selected from the group consisting of alkyl groups, alkoxy groups, alkylthio groups, alkylsilyl groups, alkylamino groups, aryl groups, aryloxy groups, arylalkyl groups, arylalkoxy groups, arylalkenyl groups, arylalkynyl groups, arylamino groups, monovalent heterocyclic groups, acyl groups, acyloxy groups, substituted carboxyl groups and cyano group. When a plurality of substituents are present, they may be the same or different. E represents O or S.]
from the standpoint of easiness of synthesis of a monomer and the fluorescence intensity of a polymer compound.

In the above-described formula (70), the aromatic ring represented by C ring and D ring includes aromatic hydrocarbon rings such as a benzene ring, naphthalene ring, anthracene ring, tetracene ring, pentacene ring, pyrene ring, phenanthrene ring and the like; and heteroaromatic rings such as a pyridine ring, bipyridine ring, phenanthroline ring, quinoline ring, isoquinoline ring, thiophene ring, furane ring, pyrrole ring and the like, and from the standpoint of easiness of synthesis of a monomer, aromatic hydrocarbon rings are preferable, and a benzene ring is more preferable.

When the C ring and D ring have the above-described substituent, alkyl groups and alkoxy groups are preferable from the standpoint of easiness of synthesis of a monomer and the solubility of a polymer compound. Further, when a plurality of substituents are present, they may be the same or different. The above-described substituents are the same as those explained and illustrated as R in the above-described formulae 1 to 38, A to I, and K.

The above-described optionally substituted divalent heterocyclic group of the formula (70) is preferably a group of the following formula (2E):

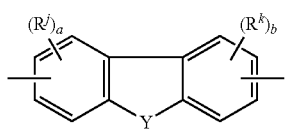
(2E)

[wherein, Y represents O or S. $R^j$ and $R^k$ represent each independently an alkyl group, alkoxy group or aryl group. a and b represent each independently 0 or 1.]
from the standpoint of easiness of synthesis of a monomer and the fluorescence intensity of a polymer compound.

In the above-described formula (2E), $R^j$ and $R^k$ are preferably identical (namely, both groups represent a hydrogen atom, alkyl group, alkoxy group or aryl group), and alkoxy groups are preferable, from the standpoint of easiness of synthesis of a monomer. The alkyl group and aryl group represented by $R^j$ and $R^k$ are the same as those explained and illustrated as the above-described group represented by $R^a$ to $R^f$. Further, the alkoxy group represented by $R^j$ and $R^k$ is preferably a butoxy group, i-butoxy group, t-butoxy group, pentyloxy group, hexyloxy group, heptyloxy group, octyloxy group, 2-ethylhexyloxy group, nonyloxy group, decyloxy group, 3,7-dimethyloctyloxy group or lauryloxy group, and further preferably a pentyloxy group, hexyloxy group, octyloxy group, 2-ethylhexyloxy group, decyloxy group or 3,7-dimethyloctyloxy group, from the standpoint of the solubility of a polymer compound and fluorescence intensity thereof.

As the above-described optionally substituted divalent heterocyclic group, preferable are groups containing silicon, nitrogen, oxygen, sulfur, selenium and the like as a heteroatom and having a fluorene structure (the above-described formulae 79 to 93), 5-membered ring heterocyclic groups containing sulfur and the like as a heteroatom, connecting at an α-position of the heteroatom to form a dimer or oligomer (the above-described formulae 109 to 110), 5-membered ring heterocyclic groups containing silicon, nitrogen, oxygen, sulfur, selenium and the like as a hetero atom, connecting at an α-position of the heteroatom to a phenyl group (the above-described formulae 111 to 117) and the like, including those of the above-described (70) and the above-described formula (2E), from the standpoint of easiness of synthesis of a monomer and the fluorescence intensity of a polymer compound.

In the above-described formula (2), $Z_2$ preferably represents —$CR_3$=$CR_4$— from the standpoint of oxidation stability in atmospheric air. The alkyl group represented by $R_3$, $R_4$ has the same meaning as explained and illustrated for R.

In the above-described formula (2), the aryl group and monovalent heterocyclic group represented by $R_3$, $R_4$ have the same meanings as explained and illustrated as the above-described aryl group and monovalent heterocyclic group represented by $R_1$, $R_2$.

Specific examples of the above-described repeating unit of the formula (2) include those of the following formulae.

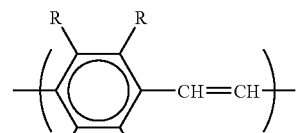

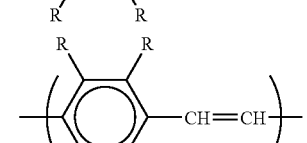

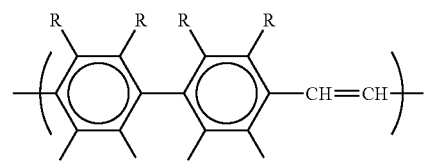

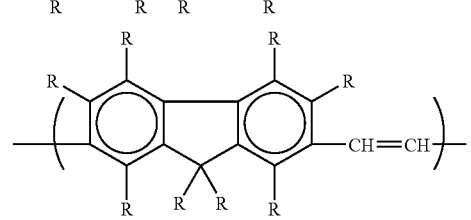

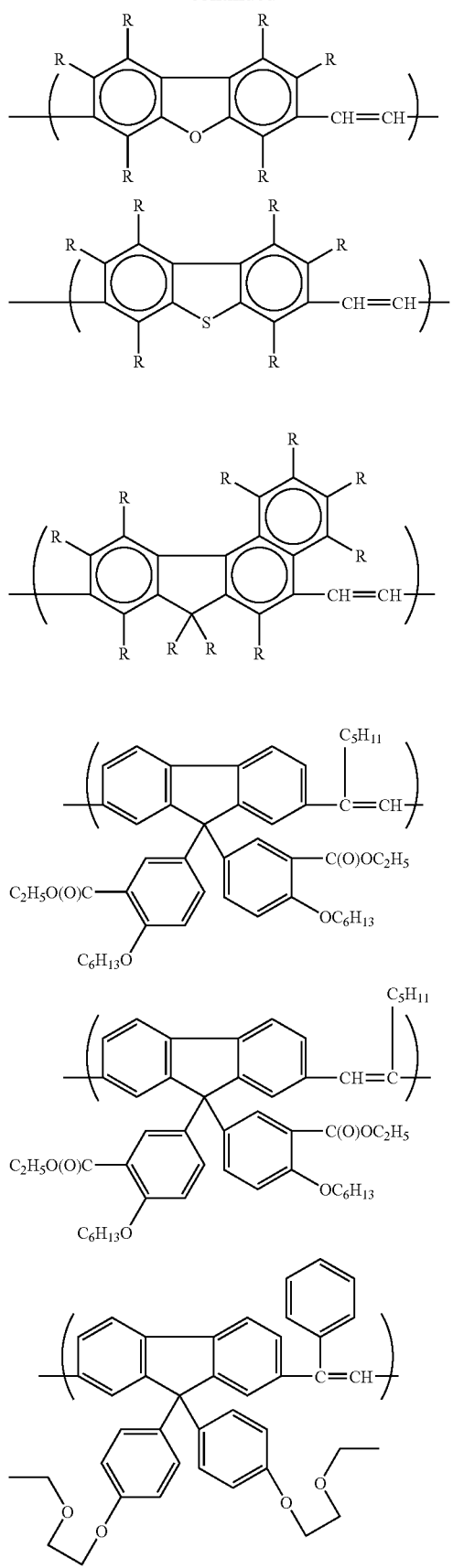
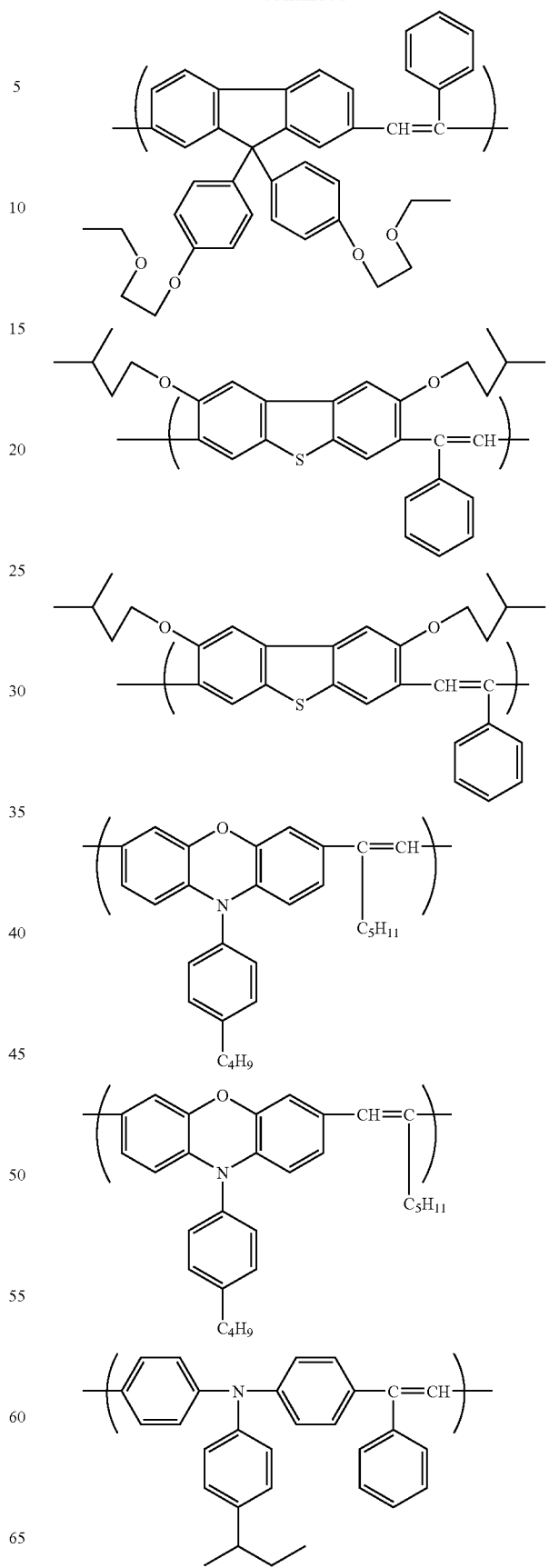

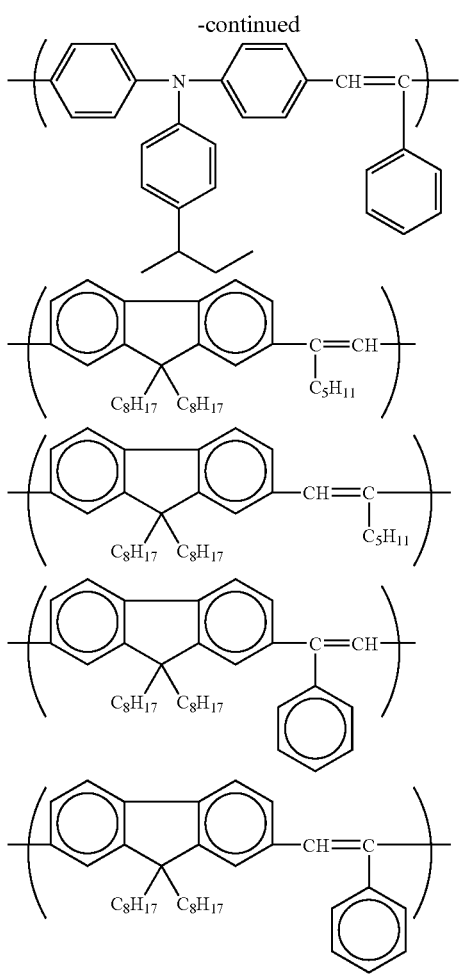

In the above-described formulae, Rs have each independently the same meanings as described above. A plurality of Rs are present in one structural formula, and they may be the same or different.

Repeating Unit of the Formula (1)/Repeating Unit of the Formula (2)

In the polymer compound of the present invention, the sum of the above-described repeating units of the formula (1) is usually 0.5 to 100 mol % with respect to all repeating units in the polymer compound, and from the standpoint of enhancement of bathochromaticity of red color, it is preferably 2 to 80 mol % with respect to all repeating units in the polymer compound. Further, from the standpoint of the solubility of a polymer compound, it is preferably 2 to 50 mol % with respect to all repeating units in the polymer compound.

When the polymer compound of the present invention contains the above-described repeating unit of the formula (1) and the above-described repeating unit of the formula (2), it is more preferable that the sum of the above-described repeating units of the formula (1) and the above-described repeating units of the formula (2) is 50 mol % or more with respect to all repeating units in the polymer compound and the amount of the above-described repeating units of the formula (1) is 2 to 80 mol % with respect to the sum of the above-described repeating units of the formula (1) and the above-described repeating units of the formula (2), from the standpoint of elongation of fluorescence spectrum.

When the polymer compound of the present invention contains the above-described repeating unit of the formula (1) and the above-described repeating unit of the formula (2), mentioned as specific examples thereof are copolymers composed of one or more units of the following formulae:

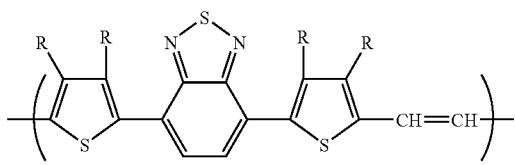

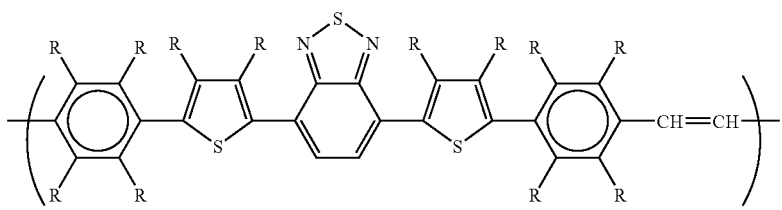

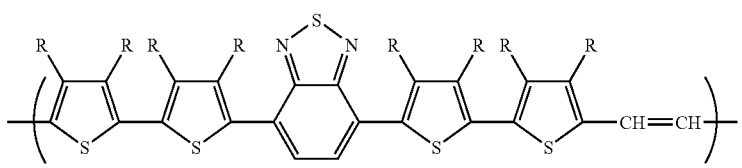

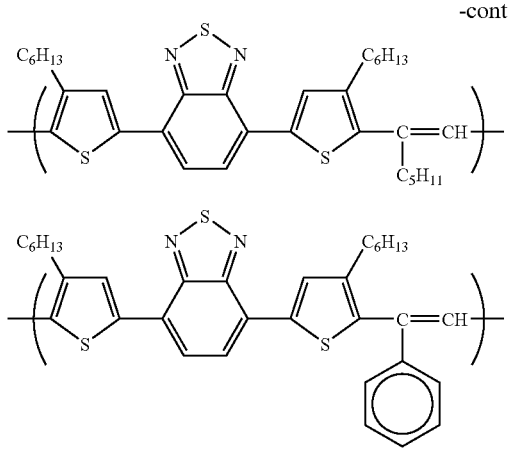
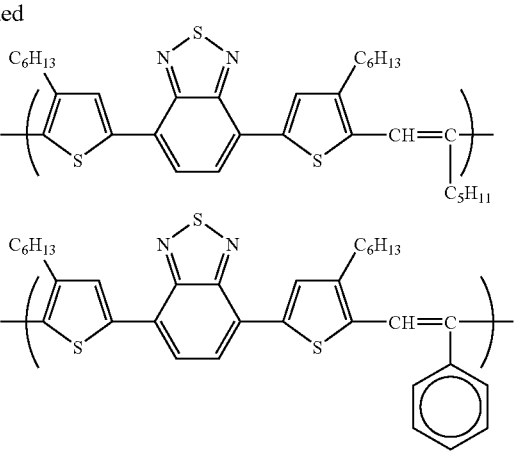
as the above-described repeating unit of the formula (1), and one or more units of the following formulae:
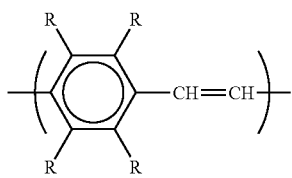
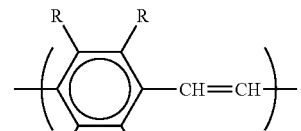
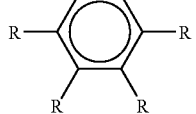
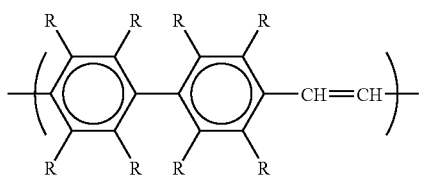
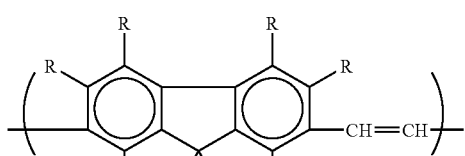
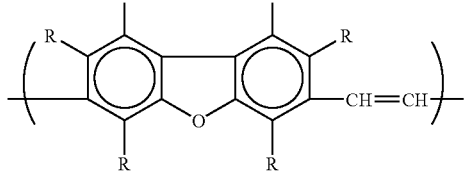
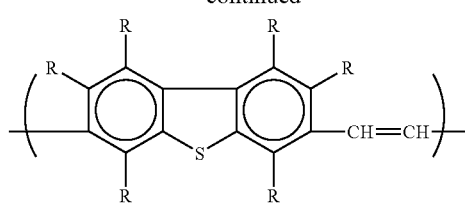
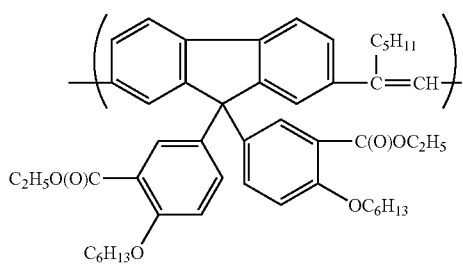
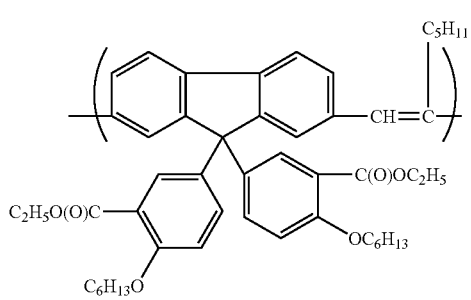

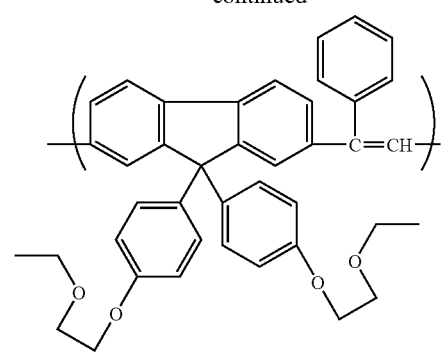
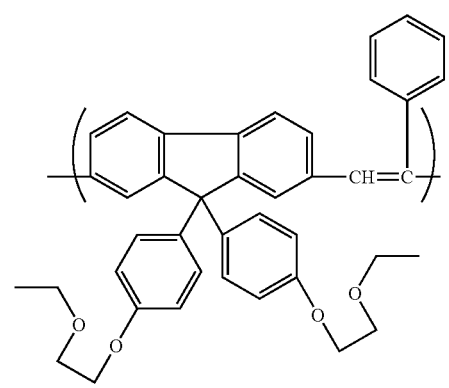
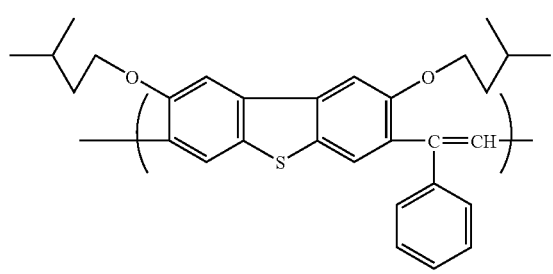
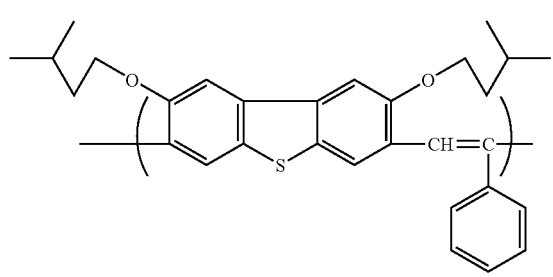
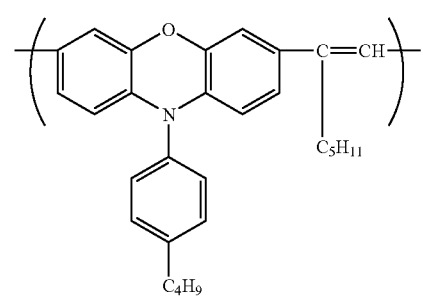

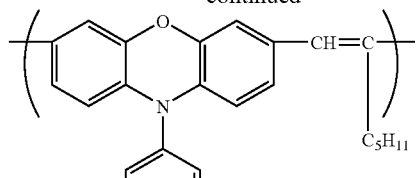
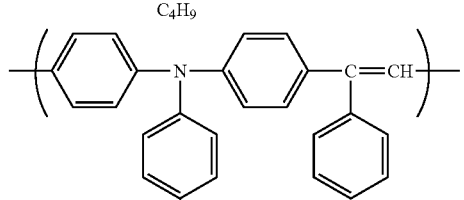
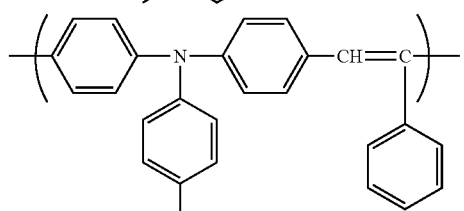
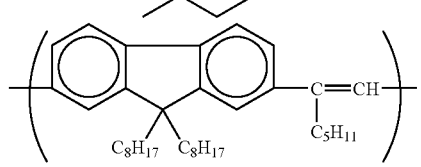
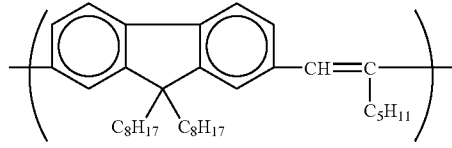
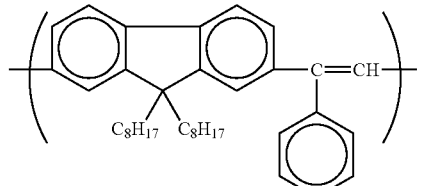
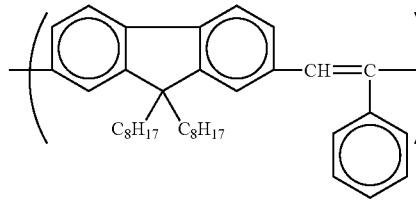

(wherein, R has the same meaning as described above) as the above-described repeating unit of the formula (2).

Other Portions

The end of the polymer compound of the present invention may be protected by a stable group since when a polymerization active group remains intact, there is a possibility of decrease in light emitting property and life when made into a device. A structure containing a conjugation bond continuous with a conjugation structure of the main chain is preferable, and for example, a structure connecting to an aryl group or heterocyclic group via a vinylene group may also be permissible. Specific examples include substituents described in chemical formula 10 in Japanese Patent Application Laid-Open (JP-A) No. 9-45478, and the like.

The polymer compound of the present invention may contain a repeating unit other than the above-described repeating units of the formula (1) and the above-described repeating units of the formula (2), in a range not deteriorating a light emitting property and charge transporting property. Further, repeating units may be connected by vinylene or a non-conjugation portion, or vinylene or a non-conjugation portion may be contained in the repeating unit. Examples of the connecting structure containing a non-conjugation portion include those described below, combinations of those described below with a vinylene group, and combinations of two or more of those described below, and the like.

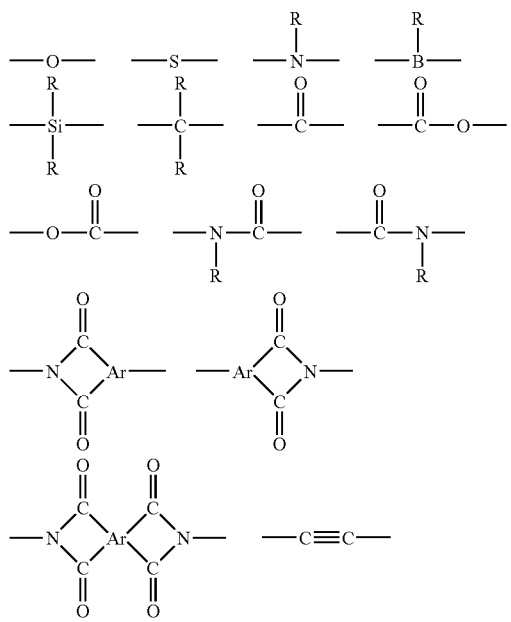

(wherein, R has the same meaning as described above, Ar represents a hydrocarbon group having 6 to 60 carbon atoms.).

The polymer compound of the present invention may be a random copolymer, block copolymer, graft copolymer or alternate copolymer, or a polymer having an intermediate structure between them, for example, a random copolymer having a block property. From the standpoint of obtaining a polymer compound having high fluorescence quantum yield, a random copolymer having a block property and a block or graft copolymer are more preferable than a complete random copolymer. Those having branching in the main chain and thus having 3 or more end parts, and dendrimers are also included.

The good solvent for the polymer compound of the present invention includes chloroform, methylene chloride, dichloroethane, tetrahydrofuran, toluene, xylene, mesitylene, tetralin, decalin, n-butylbenzene and the like. Depending on the structure and molecular weight of the polymer compound, the polymer compound of the present invention can be dissolved usually in an amount of 0.1 wt % or more in these solvents.

Production Method

Next, the method of producing a polymer compound of the present invention will be illustrated.

The method of producing a polymer compound of the present invention includes for example, a method described in JP-A No. 5-202355. That is, examples include methods such as polymerization by the Wittig reaction of a compound having an aldehyde group and a compound having a phosphonium salt group, or of a compound having an aldehyde group and a phosphonium salt group, polymerization by the Heck reaction of a compound having a vinyl group and a compound having a halogen group, or of a compound having a vinyl group and a halogen group, polymerization by the Horner-Wadsworth-Emmons method of a compound having an aldehyde group and a compound having an alkyl sulfonate group, or of a compound having an aldehyde group and an alkyl sulfonate group, polycondensation by the de-hydrohalogenation method of a compound having two or more methyl halide groups, polycondensation by the sulfonium salt decomposition method of a compound having two or more sulfonium salt groups, polymerization by the Knoevenagel reaction of a compound having an aldehyde group and a compound having an acetonitrile group, or of a compound having an aldehyde group and an acetonitrile group, and the like, and methods such as polymerization by the McMurry reaction of a compound having two or more aldehyde groups, and the like. Further, a method of polymerization by the Suzuki coupling reaction from the correspondent monomers is illustrated.

Of them, methods of polymerization by the Wittig reaction, polymerization by the Heck reaction, polymerization by the Horner-Wadsworth-Emmons reaction, polymerization by the Knoevenagel method, and polymerization by the Suzuki coupling reaction are preferable since the structure is easily controlled.

The organic solvent varies with the compound and reaction to be used, and for suppressing a side reaction, in general, it is preferable that the solvent to be used is subjected to a sufficient deoxidation treatment and the reaction is progressed under an inert atmosphere. Further, it is preferable to perform a dehydration treatment likewise (however, this is not the case when a reaction in a two-phase system with water such as the Suzuki coupling reaction is conducted.).

For progressing the reaction, an alkali and a suitable catalyst are added appropriately. These may be selected depending on the reaction to be used. As the alkali and catalyst, those dissolved sufficiently in a solvent used in the reaction are preferable. The method of mixing an alkali and a catalyst includes a method in which a solution of an alkali and a catalyst is added slowly while stirring the reaction liquid under an inert atmosphere such as argon, nitrogen and the like, and a method in which the reaction liquid is added slowly to a solution of an alkali and a catalyst.

Production conditions are more specifically explained as follows: in case of the Wittig reaction, Horner reaction and the like, the reaction is carried out using an alkali in an amount equivalent or more, preferably 1 to 3 equivalents with respect to the functional group of the monomer. The alkali is not particularly limited, and for example, metal alcoholates such as potassium-t-butoxide, sodium-t-butoxide, sodium ethylate, lithium methylate and the like can be used. As the solvent, N,N-dimethylformamide, tetrahydrofuran, dioxane, toluene and the like are used. The reaction can be progressed usually at a reaction temperature ranging from room temperature to about 150° C. The reaction time is, for example, from 5 minutes to 40 hours, and since only a time for sufficient progress of the polymerization is necessary and there is no need to leave the reaction for long time after completion of the reaction, 10 minutes to 24 hours are preferable. The concentration in the reaction may be appropriately selected in a range of from about 0.01% by weight to the maximal soluble concentration since the too dilute concentration deteriorates reaction efficiency and the too dense concentration deteriorates controlability of the reaction, and usually in a range of from 0.1% by weight to 20% by weight. In case of the Heck reaction, a monomer is subjected to the reaction using a palladium catalyst in the presence of a base such as triethylamine and the like. A solvent having relatively high boiling point such as N,N-dimethylformamide, N-methylpyrrolidone and the like is used, the reaction temperature is in the order of about from 80 to 160° C. and the reaction time is in the order of about from 1 to 100 hours.

In case of the Suzuki coupling reaction, the reaction is carried out by using a catalyst such as for example palladium [tetrakis(triphenylphosphine)], palladium acetates, dichlorobis(triphenylphosphine)palladium (II) and the like, with addition of an inorganic base such as potassium carbonate, sodium carbonate, barium hydroxide and the like, an organic base such as triethylamine and the like and an inorganic salt such as cesium fluoride and the like in an amount of equivalent or more, preferably 1 to 10 equivalents with respect to the monomer. Examples of the solvent include N,N-dimethylformamide, toluene, dimethoxyethane, tetrahydrofuran and the like. The base may be added in the form of aqueous solution, and reacted in a two-phase system (in the case of reaction in a two-phase system, a phase transfer catalyst such as a quaternary ammonium salt and the like may be added, if necessary). Depending on the solvent, the reaction temperature to be used is suitably about from 50 to 160° C. It is also permissible that the temperature is raised to around the boiling point of the solvent, to cause reflux. The reaction temperature is about from 0.5 to 200 hours. The reaction is carried out under an inert atmosphere such as an argon gas, nitrogen gas and the like under conditions not deactivating the catalyst.

Application of Polymer Compound

The polymer compound of the present invention is useful, for example, as a light emitting material. When the polymer compound of the present invention is used as a light emitting material of a polymer light emitting device, its purity exerts an influence on a light emitting property, therefore, it is preferable to purify a monomer before polymerization by a method such as distillation, sublimation purification, re-crystallization and the like before effecting polymerization, and ti is preferable, after polymerization, to carry out a refinement treatment such as re-precipitation purification, chromatographic fractionation and the like. The polymer compound of the present invention is useful also for a thin film, organic transistor, solar battery and the like.

<Composition (Liquid Composition)>

The composition of the present invention contains the above-described polymer compound and a compound having a polystyrene-reduced number average molecular weight of $1 \times 10^3$ to $1 \times 10^8$ other than the polymer compound. Examples of the compound having a polystyrene-reduced number average molecular weight of $1 \times 10^3$ to $1 \times 10^8$ other than the polymer compound include poly(phenylene) and derivatives thereof, poly(fluorene) and derivatives thereof, poly(benzofluorene) and derivatives thereof, poly(dibenzofuran) and derivatives thereof, poly(dibenzothiophene) and derivatives thereof, poly(carbazole) and derivatives thereof, poly(thiophene) and derivatives thereof, poly(phenylenevinylene) and derivatives thereof, poly(fluorenevinylene) and derivatives thereof, poly(benzofluorenevinylene) and derivatives thereof, poly(dibenzofuranvinylene) and derivatives thereof, and the like. These derivatives are those other than the repeating unit of the formula (1).

In the composition of the present invention, the proportion of the compound having a polystyrene-reduced number average molecular weight of $1 \times 10^3$ to $1 \times 10^8$ other than the polymer compound to be contained is 0.5 to 99.5 mol %, preferably 10 to 95 mol % with respect to the sum of all repeating units in the polymer compound and all repeating units in the compound other than the polymer compound.

The liquid composition of the present invention is useful for manufacturing of an organic transistor and a light emitting device such as a polymer light emitting device or the like. The liquid composition contains the above-described polymer compound and a solvent. In this specification, "liquid composition" means a composition which is liquid in device production, and typically, one which is liquid at normal pressure (namely, 1 atm) and 25° C. The liquid composition is, in general, referred to as ink, ink composition, solution or the like in some cases.

The liquid composition of the present invention may contain a low molecular weight light emitting material, hole transporting material, electron transporting material, stabilizer, additives for controlling viscosity and/or surface tension, antioxidant and the like, in addition to the above-described polymer compound. These optional components may be used each singly or in combination of two or more.

Examples of the low molecular weight light emitting material which may be contained in the liquid composition of the present invention include fluorescent materials of low molecular weight such as naphthalene derivatives, anthracene, anthracene derivatives, perylene, perylene derivatives, polymethine coloring matters, xanthene coloring matters, coumarin coloring matters, cyanine coloring matters, metal complexes having a metal complex of 8-hydroxyquinoline as a ligand, metal complexes having a 8-hydroxyquinoline derivative as a ligand, other fluorescent metal complexes, aromatic amines, tetraphenylcyclopentadiene, tetraphenylcyclopentadiene derivatives, tetraphenylcyclobutadiene, tetraphenylcyclobutadiene derivatives, stilbenes, silicon-containing aromatics, oxazoles, furoxans, thiazoles, tetraarylmethanes, thiadiazoles, pyrazoles, metacyclophanes, acetylenes and the like. Specific examples thereof include those described in JP-A Nos. 57-51781, 59-194393 and the like, and known materials.

Examples of the hole transporting material which may be contained in the liquid composition of the present invention include polyvinylcarbazole and derivatives thereof, polysilane and derivatives thereof, polysiloxane derivatives having an aromatic amine on the side chain or main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylenevinylene) and derivatives thereof, poly(2,5-thienylenevinylene) and derivatives thereof, and the like.

Examples of the electron transporting material which may be contained in the liquid composition of the present invention include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivative, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, and the like.

Examples of the stabilizer which may be contained in the liquid composition of the present invention include phenol antioxidants, phosphorus antioxidants and the like.

As the additives for controlling viscosity and/or surface tension which may be contained in the liquid composition of the present invention, for example, a compound of high molecular weight for increasing viscosity (thickening agent) and a poor solvent, a compound of low molecular weight for decreasing viscosity, a surfactant for decreasing surface tension, and the like may be appropriately combined and used.

As the above-described compound of high molecular weight, those not disturbing light emission and charge transportation may be permissible, and usually, these are soluble in a solvent of the liquid composition. As the compound of high molecular weight, for example, polystyrene of high molecular weight, polymethyl methacrylate of high molecular weight, and the like can be used. The above-described compound of high molecular weight has a polystyrene-reduced number average molecular weight of preferably 500000 or more, more preferably 1000000 or more. Also a poor solvent can be used as a thickening agent.

As the antioxidant which may be contained in the liquid composition of the present invention, those not disturbing light emission and charge transportation may be permissible, and when the composition contains a solvent, these are usually soluble in the solvent. The antioxidant includes phenol antioxidants, phosphorus antioxidants and the like. By use of the antioxidant, preservation stability of the above-described polymer compound and solvent can be improved.

When the liquid composition of the present invention contains a hole transporting material, the proportion of the hole transporting material in the liquid composition is usually 1 wt % to 80 wt %, preferably 5 wt % to 60 wt %. When the liquid composition of the present invention contains an electron transporting material, the proportion of the electron transporting material in the liquid composition is usually 1 wt % to 80 wt %, preferably 5 wt % to 60 wt %.

In the case of firm formation using this liquid composition in producing a polymer light emitting device, it may be advantageous to only remove a solvent by drying after application of the liquid composition, and also in the case of mixing of a charge transporting material and a light emitting material, the same means can be applied, that is, this method is extremely advantageous for production. In drying, drying may be effected under heating at about from 50 to 150° C., alternatively, drying may be carried out under reduced pressure of about $10^{-3}$ Pa.

For film formation using a liquid composition, methods such as a spin coat method, casting method, micro gravure coat method, gravure coat method, bar coat method, roll coat method, wire bar coat method, dip coat method, spray coat method, screen printing method, flexo printing method, offset printing method, inkjet print method and the like can be used.

The proportion of a solvent in the liquid composition is usually 1 wt % to 99.9 wt %, preferably 60 wt % to 99.9 wt %, further preferably 90 wt % to 99.8 wt % with respect to the total weight of the liquid composition. Though the viscosity of the liquid composition varies depending on a printing method, the viscosity at 25° C. is preferably in a range of 0.5 to 500 mPa·s, and when a liquid composition passes through a discharge apparatus such as in an inkjet print method and the like, the viscosity at 25° C. is preferably in a range of 0.5 to 20 mPa·s, for preventing clogging and flying curving in discharging.

As the solvent contained in the liquid composition, those capable of dissolving or dispersing components other than the solvent in the liquid composition are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene, trimethylbenzene, mesitylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, methyl benzoate, ethylcellosolve acetate and the like, polyhydric alcohols and derivatives thereof such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexane diol and the like, alcohol solvent such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide, and the like. These solvents may be used singly or in combination of two or more. Among the above-described solvents, one or more organic solvents having a structure containing at least one benzene ring and having a melting point of 0° C. or lower and a boiling point of 100° C. or higher are preferably contained from the standpoint of viscosity, film formability and the like.

Regarding the kind of the solvent, aromatic hydrocarbon solvents, aliphatic hydrocarbon solvents, ester solvents and ketone solvents are preferable from the standpoint of solubility of components other than the solvent in a liquid composition into the organic solvent, uniformity in film formation, viscosity property and the like, and preferable are toluene, xylene, ethylbenzene, diethylbenzene, trimethylbenzene, mesitylene, n-propylbenzene, i-propylbenzene, n-butylbenzene, i-butylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methylbenzoate, 2-propylcyclohexanone, 2-heptanone, 3-heptanone, 4-heptanone, 2-octanone, 2-nonanone, 2-decanone and dicyclohexyl ketone, and it is more preferable to contain at least one of xylene, anisole, mesitylene, cyclohexylbenzene and bicyclohexylmethyl benzoate.

The number of the solvent to be contained in the liquid composition is preferably 2 or more, more preferably 2 to 3, further preferably 2 from the standpoint of film formability and from the standpoint of a device property and the like.

When two solvents are contained in a liquid composition, one of them may be solid at 25° C. From the standpoint of film formability, it is preferable that one solvent has a boiling point of 180° C. or higher and another solvent has a boiling point of lower than 180° C. and it is more preferable that one solvent has a boiling point of 200° C. or higher and another solvent has a boiling point of lower than 180° C. From the standpoint of viscosity, it is preferable that 0.2 wt % or more of components excepting solvents from a liquid composition are dissolved at 60° C. in solvents, and it is preferable that 0.2 wt % or more of components excepting solvents from a liquid composition are dissolved at 25° C. in one of two solvents.

When three solvents are contained in a liquid composition, one or two of them may be solid at 25° C. From the standpoint of film formability, it is preferable that at least one of three solvents has a boiling point of 180° C. or higher and at least one solvent has a boiling point of lower than 180° C., and it is more preferable that at least one of three solvents has a boiling point of 200° C. or higher and 300° C. or lower and at least one solvent has a boiling point of 180° C. or lower. From the standpoint of viscosity, it is preferable that 0.2 wt % or more of components excepting solvents from a liquid composition are dissolved at 60° C. in two of three solvents, and it is preferable that 0.2 wt % or more of components excepting solvents from a liquid composition are dissolved at 25° C. in one of three solvents.

When two or more solvents are contained in a liquid composition, the content of a solvent having highest boiling point is preferably 40 to 90 wt %, more preferably 50 to 90 wt %, further preferably 65 to 85 wt % with respect to the weight of all solvents contained in the liquid composition, from the standpoint of viscosity and film formability.

—Thin Film—

The thin film of the present invention will be illustrated. This thin film is obtained by using the above-described polymer compound. Examples of the thin film include light emitting thin films, electric conductive thin films, organic semiconductor thin films and the like.

The light emitting thin film has a quantum yield of light emission of preferably 50% or more, more preferably 60% or more, further preferably 70% or more from the standpoint of the luminance, light emission voltage and the like of a device.

The electric conductive thin film preferably has a surface resistance of 1 KΩ/□ or less. By doping a thin film with a Lewis acid, ionic compound or the like, electric conductivity can be enhanced. The surface resistance is more preferably 100Ω/□ or less, further preferably 10Ω/□ or less.

In the organic semiconductor thin film, one larger parameter of electron mobility or hole mobility is preferably $10^{-5}$ cm$^2$/V/s or more, more preferably $10^{-3}$ cm$^2$/V/s or more, and further preferably $10^{-1}$ cm$^2$/V/s or more. Using an organic semiconductor thin film, an organic transistor can be manufactures. Specifically, by forming the organic semiconductor thin film on a Si substrate carrying a gate electrode and an insulation film of $SiO_2$ and the like formed thereon, and forming a source electrode and a drain electrode with Au and the like, an organic transistor can be obtained.

—Organic Transistor (Polymer Electric Field Effect Transistor)—

Next, a polymer electric field effect transistor as one embodiment of organic transistors will be described.

The polymer compound of the present invention can be suitably used as a material of a polymer electric field effect transistor, particularly, as an active layer. Regarding the structure of a polymer electric field effect transistor, it may be usually advantageous that a source electrode and a drain electrode are placed in contact with an active layer made of a polymer, further, a gate electrode is placed sandwiching an insulation layer in contact with the active layer.

The polymer electric field effect transistor is usually formed on a supporting substrate. The material of the supporting substrate is not particularly restricted providing it does not disturb a property as an electric field effect transistor, and glass substrates and flexible film substrates and plastic substrates can also be used.

The polymer electric field effect transistor can be produced by known methods, for example, a method described in JP-A No. 5-110069.

It is very advantageous and preferable for production to use a polymer compound soluble in an organic solvent, in forming an active layer. As a method of film formation from a solution prepared by dissolving an organic solvent-soluble polymer compound in a solvent, methods such as a spin coat method, casting method, micro gravure coat method, gravure coat method, bar coat method, roll coat method, wire bar coat method, dip coat method, spray coat method, nozzle coat method, capillary coat method, screen printing method, flexo printing method, offset printing method, inkjet printing method and the like can be used.

Preferable is an encapsulated polymer electric field effect transistor obtained by manufacturing a polymer electric field effect transistor, then, encapsulating this. By this, the polymer electric field effect transistor is blocked from atmospheric air, thereby, lowering of properties of the polymer electric field effect transistor can be suppressed.

As the encapsulation method, a method of covering with an ultraviolet (UV) hardening resin, thermosetting resin, or inorganic SiONx film and the like, a method of pasting a glass plate or film with an UV hardening resin, thermosetting resin or the like, and other methods are mentioned. For effectively performing blocking from atmospheric air, it is preferable that processes after manufacturing of a polymer electric field effect transistor until encapsulation are carried out without exposing to atmospheric air (for example, in dried nitrogen atmosphere, vacuum and the like).

—Organic Solar Battery—

Next, the organic solar battery will be described. A solid photoelectric conversion device utilizing a photoelectromotive force effect as an organic photoelectric conversion device as one embodiment of organic solar batteries will be described.

The polymer compound of the present invention can be suitably used as a material of an organic photoelectric conversion device, particularly, as an organic semiconductor layer of a schottky barrier type device utilizing an interface between an organic semiconductor and a metal, or as an organic semiconductor layer of a pn hetero junction type device utilizing an interface between an organic semiconductor and an inorganic semiconductor or between organic semiconductors.

Further, the polymer compound of the present invention can be suitably used as an electron donating polymer or an electron accepting polymer in a bulk hetero junction type device in which the donor-acceptor contact area is increased, or an electron donating conjugated polymer (dispersion supporting body) of an organic photoelectric conversion device using a high molecular weight-low molecular weight complex system, for example, a bulk hetero junction type organic photoelectric conversion device containing a dispersed fullerene derivative as an electron acceptor.

With respect to the structure of the organic photoelectric conversion device, in the case of for example a pn hetero junction type device, it is advantageous that a p type semiconductor layer is formed on an ohmic electrode, for example, on ITO, further, an n type semiconductor layer is laminated, and an ohmic electrode is provided thereon.

The organic photoelectric conversion device is usually formed on a supporting substrate. The material of the supporting substrate is not particularly restricted providing it does not disturb a property as an organic photoelectric conversion device, and glass substrates and flexible film substrates and plastic substrates can also be used.

The organic photoelectric conversion device can be produced by known methods, for example, a method described in Synth. Met., 102, 982 (1999), and a method described in Science, 270, 1789 (1995).

<Light Emitting Material>

The polymer compound of the present invention can be used in a light emitting material. This light emitting material contains a polymer compound of the present invention.

This light emitting material may contain known illuminant materials. As the illuminant material, for example, naphthalene derivatives, anthracene and derivatives thereof, perylene and derivatives thereof, coloring matters such as polymethines, xanthenes, coumarins and cyanines, metal complexes of 8-hydroxyquinoline and derivatives thereof, aromatic amines, tetraphenylcyclopentadiene and derivatives thereof, tetraphenylbutadiene and derivatives thereof, and the like are mentioned. As such light emitting materials, for example, those described in JP-A Nos. 57-51781, 59-194393, and the like are mentioned. As the above-described illuminant material, metal complexes showing light emission from triplet excited state (triplet light emitting complex: including also, for example, complexes showing phosphorescence emission, or fluorescence emission in addition to this phosphorescence emission), for example, conventionally known EL illuminant materials of low molecular weight, and the like are mentioned.

<Polymer Light Emitting Device>

Next, the polymer light emitting device of the present invention will be described.

The polymer light emitting device of the present invention contains electrodes composed of an anode and a cathode, and a light emitting layer between the electrodes and containing the above-described polymer compound.

The polymer light emitting device of the present invention includes (1) a polymer light emitting device having an electron transporting layer provided between a cathode and a light emitting layer, (2) a polymer light emitting device having a hole transporting layer provided between an anode and a light emitting layer, (3) a polymer light emitting device having an electron transporting layer provided between a cathode and a light emitting layer and having a hole transporting layer provided between an anode and a light emitting layer; and the like.

More specific examples include, the following structures a) to d).

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, / means adjacent lamination of layers, being applicable also in the following descriptions.)

Here, the light emitting layer is a layer having a function of emitting light. The hole transporting layer is a layer having a function of transporting holes, and the electron transporting layer is a layer having a function of transporting electrons. The electron transporting layer and hole transporting layer are collectively called a charge transporting layer. Each of these light emitting layers, hole transporting layers and electron transporting layers may be independently used in combination of two or more.

Though the method of film formation of a light emitting layer is not restricted, methods of film formation from a solution are illustrated.

For film formation from a solution, methods such as a spin coat method, casting method, micro gravure coat method, gravure coat method, bar coat method, roll coat method, wire bar coat method, dip coat method, spray coat method, nozzle coat method, capillary coat method, screen printing method, flexo printing method, offset printing method, inkjet print method and the like can be used.

In the case of film formation from a solution using a polymer compound of the present invention in producing a polymer light emitting device, it may be advantageous to only remove a solvent by drying after application of this solution, and also in the case of mixing of a charge transporting material and a light emitting material, the same means can be applied, that is, this method is extremely advantageous for production.

The thickness of a light emitting layer shows an optimum value varying depending on a material to be used, and may be advantageously regulated so as to give appropriate values of driving voltage and light emission efficiency, and is, for example, 1 nm to 1 μm, preferably 2 nm to 500 nm, further preferably 5 nm to 200 nm.

In the polymer light emitting device of the present invention, a light emitting material other than the above-described polymer compound may be mixed in a light emitting layer. Further, a light emitting layer containing a light emitting material other than the above-described polymer compound may be laminated to a light emitting layer containing the above-described polymer compound, in the polymer light emitting device of the present invention.

As the light emitting material other than the above-described polymer compound, known materials can be used. Examples of the compounds of low molecular weight include naphthalene derivatives, anthracene and derivatives thereof, perylene and derivatives thereof, coloring matters such as polymethines, xanthenes, coumarins and cyanines, metal complexes of 8-hydroxyquinoline and derivatives thereof, aromatic amines, tetraphenylcyclopentadiene and derivatives is thereof, tetraphenylbutadiene and derivatives thereof, and the like. Specifically, known materials such as those described in, for example, JP-A Nos. 57-51781, 59-194393, and the like can be used.

When the polymer light emitting device of the present invention contains a hole transporting layer, examples of the hole transporting material to be used include polyvinylcarbazole and its derivatives, polysilane and its derivatives, polysiloxane derivatives having an aromatic amine on the side chain or main chain, pyrazoline derivatives, arylamine derivatives, stilbene derivatives, triphenyldiamine derivatives, polyaniline and its derivatives, polythiophene and its derivatives, polypyrrole and its derivatives, poly(p-phenylenevinylene) and its derivatives, poly(2,5-thienylenevinylene) and its derivatives, and the like. Specific examples of the hole transporting material includes those described in JP-A Nos. 63-70257, 63-175860, 2-135359, 2-135361, 2-209988, 3-37992 and 3-152184, and the like.

Among them, preferable as the hole transporting material used in a hole transporting layer are high molecular weight hole transporting materials such as polyvinylcarbazole and its derivatives, polysilane and its derivatives, polysiloxane derivatives having an aromatic amine compound group on the side chain or main chain, polyaniline and its derivatives, polythiophene and its derivatives, poly(p-phenylenevinylene) and its derivatives, poly(2,5-thienylenevinylene) and its derivatives, and the like, and further preferable are polyvinylcarbazole and its derivatives, polysilane and its derivatives, and polysiloxane derivatives having an aromatic amine on the side chain or main chain. In the case of a low molecular weight hole transporting material, it is preferable that the hole transporting material is dispersed in a polymer binder in use.

Polyvinylcarbazole and its derivative are obtained, for example, from a vinyl monomer by cation polymerization or radical polymerization.

The polysilane and its derivative include compounds described in Chem. Rev., vol. 89, p. 1359 (1989), GB Patent No. 2300196 publication, and the like. Also as the synthesis method, methods described in them can be used, and particularly, the Kipping method is suitably used.

In the polysiloxane derivative, the siloxane skeleton structure shows little hole transporting property, thus, those having a structure of the above-mentioned low molecular weight hole transporting material on the side chain or main chain are suitably used Particularly, those having an aromatic amine showing a hole transporting property on the side chain or main chain are illustrated.

The film formation method of a hole transporting layer is not particularly restricted, and in the case of use of a low molecular weight hole transporting material, a method of film formation from a mixed solution with a polymer binder is illustrated. In the case of use of a high molecular weight hole transporting material, a method of film formation from a solution is illustrated.

The solvent used for film formation from a solution is not particularly restricted providing it can dissolve a hole transporting material. Examples of the solvent include chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, ester solvents such as ethyl acetate, butyl acetate, ethylcellosolve acetate and the like.

For film formation from a solution, there can be used methods such as a spin coat method, casting method, micro gravure coat method, gravure coat method, bar coat method, roll coat method, wire bar coat method, dip coat method, spray coat method, nozzle coat method, capillary coat method, screen printing method, flexo printing method, offset printing method, inkjet print method and the like.

As the above-described polymer binder, those not extremely disturbing charge transportation are preferable, and those showing no strong absorption against visible light are suitably used. Examples of the polymer binder include polycarbonate, polyacrylate, polymethyl acrylate, polymethyl methacrylate, polystyrene, polyvinyl chloride, polysiloxane and the like.

Regarding the thickness of a hole transporting layer, the optimum value varies with a material to be used, and it may be advantageously selected so that the driving voltage and light emission efficiency become optimum, and a thickness at least causing no formation of pin holes is necessary, and when the thickness is too large, the driving voltage of a device increases undesirably. Therefore, the thickness of the hole transporting layer is, for example, 1 nm to 1 μm, preferably 2 nm to 500 nm, further preferably 5 nm to 200 nm.

When the polymer light emitting device of the present invention has an electron transporting layer, known materials can be used as the electron transporting material to be used, and examples include oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives, polyfluorene and its derivatives, and the like. Specific examples include those described in JP-A Nos. 63-70257, 63-175860, 2-135359, 2-135361, 2-209988, 3-37992 and 3-152184, and the like.

Of them, oxadiazole derivatives, benzoquinone and its derivatives, anthraquinone and its derivatives, metal complexes of 8-hydroxyquinoline and its derivatives, polyquinoline and its derivatives, polyquinoxaline and its derivatives, polyfluorene and its derivatives are preferable, and 2-(4-biphenylyl)-5-(4-t-butylphenyl)-1,3,4-oxadiazole, benzoquinone, anthraquinone, tris(8-quinolinol)aluminum and polyquinoline are further preferable.

The film formation method of an electron transporting layer is not particularly restricted, and in the case of use of an electron transporting material of low molecular weight, examples include a vacuum vapor-deposition method from powder, film formation methods from solution or melted conditions, and in the case of use of an electron transporting material of high molecular weight, examples include film formation methods from solution or melted condition, respectively. In film formation from solution or melted condition, a polymer binder may be used together.

The solvent used for film formation from a solution is not particularly restricted providing it can dissolve an electron transporting material and/or polymer binder. Examples of the solvent include chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, ester solvents such as ethyl acetate, butyl acetate, ethylcellosolve acetate and the like.

For film formation from solution or melted conditions, methods such as a spin coat method, casting method, micro gravure coat method, gravure coat method, bar coat method, roll coat method, wire bar coat method, dip coat method, spray coat method, nozzle coat method, capillary coat method, screen printing method, flexo printing method, offset printing method, inkjet printing method and the like can be used.

As the polymer binder to be mixed, those not extremely disturbing charge transportation are preferable, and those showing no strong absorption against visible light are suitably used. Examples of the polymer binder are poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride, polysiloxane and the like.

Regarding the thickness of an electron transporting layer, the optimum value varies depending on a material to be used, and it may be advantageously selected so that the driving voltage and light emission efficiency become optimum, and a thickness at least causing no formation of pin holes is necessary, and when the thickness is too large, the driving voltage of a device increases undesirably. Therefore, the thickness of the electron transporting layer is, for example, 1 nm to 1 μm, preferably 2 nm to 500 nm, further preferably 5 nm to 200 nm.

Among charge transporting layers provided adjacent to an electrode, those having a function of improving charge injection efficiency from an electrode and having an effect of lowering the driving voltage of a device are, in particularly, called generally a charge injection layer (hole injection layer, electron injection layer).

Further, for improving close adherence with an electrode or improving charge injection from an electron, the above-mentioned charge injection layer or an insulation layer may be provided adjacent to the electrode, alternatively, for improving close adherence of an interface or preventing mixing, a thin buffer layer may be inserted into an interface of a charge transporting layer and a light emitting layer.

The order and number of layers to be laminated, and thickness of each layer may be appropriately determined in view of light emission efficiency and device life.

In the present invention, as the polymer light emitting device carrying a provided charge injection layer (electron injection layer, hole injection layer), mentioned are polymer light emitting devices having a charge injection layer provided adjacent to a cathode and polymer light emitting devices having a charge injection layer provided adjacent to an anode.

For example, the following structures e) to p) are specifically mentioned.

e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transporting layer/light emitting layer/cathode
i) anode/hole transporting layer/light emitting layer/charge injection layer/cathode
j) anode/charge injection layer/hole transporting layer/light emitting layer/charge injection layer/cathode
k) anode/charge injection layer/light emitting layer/charge transporting layer/cathode
l) anode/light emitting layer/electron transporting layer/charge injection layer/cathode
m) anode/charge injection layer/light emitting layer/electron transporting layer/charge injection layer/cathode
n) anode/charge injection layer/hole transporting layer/light emitting layer/charge transporting layer/cathode
o) anode/hole transporting layer/light emitting layer/electron transporting layer/charge injection layer/cathode
p) anode/charge injection layer/hole transporting layer/light emitting layer/electron transporting layer/charge injection layer/cathode Specific examples of the charge injection layer include a layer containing an electric conductive polymer, a layer provided between an anode and a hole transporting layer and containing a material having ionization potential of a value between an anode material and a hole transporting material contained in a hole transporting layer, a layer provided between a cathode and an electron transporting layer and containing a material having electron affinity of a value between a cathode material and an electron transporting material contained in an electron transporting layer, and the like.

When the above-mentioned charge injection layer contains an electric conductive polymer, the electric conductivity of the electric conductive polymer is preferably $10^{-5}$ S/cm or more and $10^3$ or less, and for decreasing leak current between light emission picture elements, more preferably $10^{-5}$ S/cm or more and $10^2$ or less, further preferably $10^{-5}$ S/cm or more and $10^1$ or less. Usually, for controlling the electric conductivity of the electric conductive polymer to $10^{-5}$ S/cm or more and $10^3$ or less, the electric conductive polymer is doped with a suitable amount of ions.

As the kind of ions to be doped, an anion is used in a hole injection layer and a cation is used in an electron injection layer. Examples of the anion include a polystyrenesulfonic ion, alkylbenzenesulfonic ion, camphorsulfonic ion and the like, and examples of the cation include a lithium ion, sodium ion, potassium ion, tetrabutylammonium ion and the like.

The thickness of the charge injection layer is, for example, 1 nm to 100 nm, preferably 2 nm to 50 nm.

The material used in the charge injection layer may be appropriately selected depending on a relation with materials of an electrode and an adjacent layer, and examples include electric conductive polymers such as polyaniline and its derivatives, polythiophene and its derivatives, polypyrrole and its derivatives, polyphenylenevinylene and its derivatives, polythienylenevinylene and its derivatives, polyquinoline and its derivatives, polyquinoxaline and its derivatives, polymers containing an aromatic amine structure on the main chain or side chain, and the like, and metal phthalocyanines (copper phthalocyanine and the like), carbon and the like.

The insulation layer has a function of making charge injection easier. The average thickness of this insulation layer is usually 0.1 to 20 nm, preferably 0.5 to 10 nm, more preferably 1 to 5 nm. The material of the insulation layer includes metal fluorides, metal oxides, organic insulating materials and the like. As the polymer light emitting device carrying an insulation layer provided thereon, there are mentioned polymer light emitting devices in which an insulation layer is provided adjacent to a cathode, and polymer light emitting devices in which an insulation layer is provided adjacent to an anode.

Specifically, for example, the following structures q) to ab) are mentioned.

q) anode/insulation layer/light emitting layer/cathode
r) anode/light emitting layer/insulation layer/cathode
s) anode/insulation layer/light emitting layer/insulation layer/cathode
t) anode/insulation layer/hole transporting layer/light emitting layer/cathode
u) anode/hole transporting layer/light emitting layer/insulation layer/cathode
v) anode/insulation layer/hole transporting layer/light emitting layer/insulation layer/cathode
w) anode/insulation layer/light emitting layer/electron transporting layer/cathode
x) anode/light emitting layer/electron transporting layer/insulation layer/cathode
y) anode/insulation layer/light emitting layer/electron transporting layer/insulation layer/cathode
z) anode/insulation layer/hole transporting layer/light emitting layer/electron transporting layer/cathode
aa) anode/hole transporting layer/light emitting layer/electron transporting layer/insulation layer/cathode
ab) anode/insulation layer/hole transporting layer/light emitting layer/electron transporting layer/insulation layer/cathode The substrate which forms a polymer light emitting device of the present invention may advantageously be one which forms an electrode and which does not change in forming a layer of an organic substance, and examples include, for example, substrates of glass, plastic, polymer film, silicon and the like. In the case of an opaque substrate, it is preferable that the opposite electrode is transparent or semi-transparent.

In the present invention, it is usually preferable that at least one of electrodes composed of an anode and cathode is transparent or semi-transparent, and a cathode is transparent or semi-transparent.

As the material of the anode, an electric conductive metal oxide film, semi-transparent metal thin film and the like are used. Specifically, films (NESA and the like) formed using electric conductive glass composed of indium oxide, zinc oxide, tin oxide, and composite thereof: indium.tin.oxide (ITO), indium.zinc.oxide and the like, gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electric conductive films made of polyaniline and its derivatives, polythiophene and its derivatives, and the like may be used.

The thickness of an anode can be appropriately selected in view of light transmission and electric conductivity, and it is, for example, 10 nm to 10 μm, preferably 20 nm to 1 μm, further preferably 50 nm to 500 nm.

For making electric charge injection easier, a layer made of a phthalocyanine derivative, electric conductive polymer, carbon and the like, or a layer made of a metal oxide, metal fluoride, organic insulation material and the like, may be provided on an anode.

As the material of a cathode, materials of small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys of two or more of them, or alloys made of at least one of them and at least one of gold, silver, platinum, copper, manganese, titanium, cobalt, nickel, tungsten and tin, graphite or graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure including two or more layers.

The thickness of a cathode can be appropriately selected in view of electric conductivity and durability, and it is, for example, 10 nm to 10 μm, preferably 20 nm to 1 μm, further preferably 50 nm to 500 nm.

As the cathode manufacturing method, a vacuum vapor-deposition method, sputtering method, lamination method of thermally press-binding a metal thin film, and the like are used. A layer made of an electric conductive polymer, or a layer made of a metal oxide, metal fluoride, organic insulation material and the like, may be provided between a cathode and an organic substance layer, and after manufacturing a cathode, a protective layer for protecting the polymer light emitting device may be installed. For use of the polymer light emitting device stably for a long period of time, it is preferable to install a protective layer and/or protective cover, for protecting a device from outside.

As the protective layer, resins, metal oxides, metal fluorides, metal borides and the like can be used. As the protective cover, a glass plate, and a plastic plate having a surface which has been subjected to low water permeation treatment, and the like can be used, and a method in which the cover is pasted to a device substrate with a thermosetting resin or photo-curing resin to attain sealing is suitably used. When a space is kept using a spacer, blemishing of a device can be prevented easily. If an inert gas such as nitrogen, argon and the like is filled in this space, oxidation of a cathode can be prevented, further, by placing a drying agent such as barium oxide and the like in this space, it becomes easier to suppress moisture adsorbed in a production process from imparting damage to the device. It is preferable to adopt one strategy among these methods.

The polymer light emitting device of the present invention can be used for a sheet light source, and displays such as a segment display, dot matrix display, liquid crystal display (for example, back light and the like).

For obtaining light emission in the form of sheet using a polymer light emitting device of the present invention, it may be advantages to place a sheet anode and a sheet cathode so as to overlap. For obtaining light emission in the form of pattern, there are a method in which a mask having a window in the form of pattern is placed on the surface of the above-mentioned sheet light emitting device, a method in which an organic substance layer in non-light emitting parts is formed with extremely large thickness to give substantially no light emission, a method in which either anode or cathode, or both electrodes are formed in the form pattern. By forming a pattern by any of these methods, and placing several electrodes so that on/off is independently possible, a display of segment type is obtained which can display digits, letters, simple marks and the like. Further, for providing a dot matrix device, it may be permissible that both an anode and a cathode are formed in the form of stripe, and placed so as to cross. By using a method in which several polymer compounds showing different emission colors are painted separately or a method in which a color filter or a fluorescence conversion filter is used, partial color display and multi-color display are made possible. In the case of a dot matrix device, passive driving is possible, and active driving may be carried out in combination with TFT and the like. These displays can be used as a display of a computer, television, portable terminal, cellular telephone, car navigation, view finder of video camera, and the like.

Further, the above-mentioned sheet light emitting device is of self emitting and thin type, and can be suitably used as a sheet light source for back light of a liquid crystal display, or as a sheet light source for illumination. If a flexible substrate is used, it can also be used as a curved light source or display.

Examples will be shown below for illustrating the present invention further in detail, but the present invention is not limited to them. In the examples, the weight average molecular weight and number average molecular weight were measured as polystyrene-reduced weight average molecular weight and number average molecular weight by gel permeation chromatography (GPC) using tetrahydrofuran as a solvent.

SYNTHESIS EXAMPLE 1

Synthesis of Monomer (1)

3.3 g of 4-formylphenylboric acid and 4.86 g of a dibromo compound monomer (2) of the following structural formula:

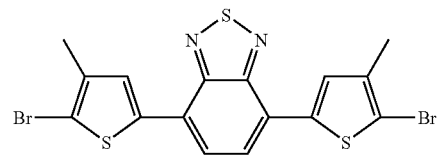

were charged in a reaction vessel, then, immediately, an atmosphere in the reaction system was purged with a nitrogen gas. Next, into this vessel was added 80 g of toluene previously deaerated by bubbling with an argon gas. To this toluene solution was added 1.6 g of tetra-n-butyl ammonium bromide. Next, 50 ml of a 16.7 wt % sodium carbonate aqueous solution previously deaerated by bubbling with an argon gas was added. This solution was completely deaerated by bubbling with an argon gas, then, 1.2 g of tetrakis(triphenylphosphine)palladium(0) was added and the mixture was heated and refluxed for 20 hours. The reaction was carried out under a nitrogen atmosphere.

This reaction solution was cooled down to around room temperature, and 100 g of toluene was added. This solution was allowed to stand still to cause liquid-partitioning, and a lower layer containing a precipitate was recovered. Next, this solution containing a precipitate was filtrated, and the precipitated material was recovered. This precipitated material was washed with a mixed solvent of methanol/ion exchange water=1/1 (volume ratio), then, dried under reduced pressure to obtain a coarse product. Next, this coarse product was dissolved in 800 ml of chloroform. This solution was filtrated, and insoluble materials were removed, then, the solvent was distilled off from this solution under reduced pressure, and the resultant product was dried under reduced pressure to obtain 0.7 g of a monomer (1) of the following structural formula:

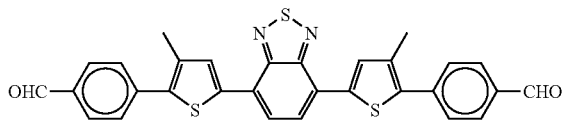

EXAMPLE 1

Synthesis of Polymer Compound 1

0.107 g of the above-described monomer (1), 0.61 g of a monomer (2) of the following structural formula:

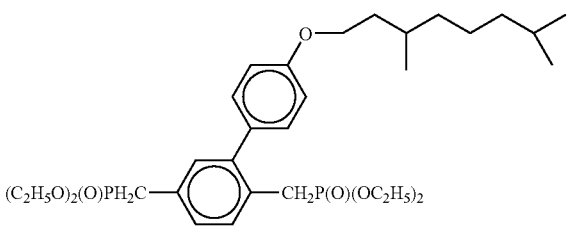

and 0.293 g of a monomer (3) of the following structural formula:

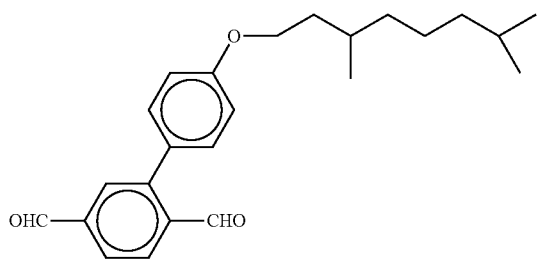

were dissolved in 50 g of dehydrated toluene. An argon gas was blown into this solution, and an atmosphere in the reaction system was purged with an argon gas by bubbling. Next, to this solution was added 0.45 g of potassium tert-butoxide, and reacted at 95° C. for 2 hours. The reaction was carried out under a nitrogen gas atmosphere.

After the reaction, this reaction solution was cooled down to around room temperature, then, acetic acid was added to the reaction solution to cause neutralization. To this solution was added 50 g of toluene, then, this solution was poured into methanol slowly, to cause re-precipitation. The generated precipitate was recovered by filtration, and this was dried under reduced pressure to obtain a polymer. Then, this polymer was dissolved in toluene, then, the resultant toluene solution was filtrated to remove insoluble materials. This toluene solution was purified by passing through an alumina column. The resultant toluene solution was concentrated under reduced pressure, then, poured into methanol to cause re-precipitation. The generated precipitate was recovered by filtration, and dried under reduced pressure to obtain 0.06 g of a polymer. Hereinafter, this polymer is called "polymer compound 1".

The polymer compound 1 had a polystyrene-reduced weight average molecular weight of $1.4 \times 10^4$ and a polystyrene-reduced number average molecular weight of $7.1 \times 10^3$.

The structures of repeating units contained in the polymer compound 1 estimated from charging are as described below, and the molar ratio estimated from charging is repeating unit J:repeating unit K=9:1.

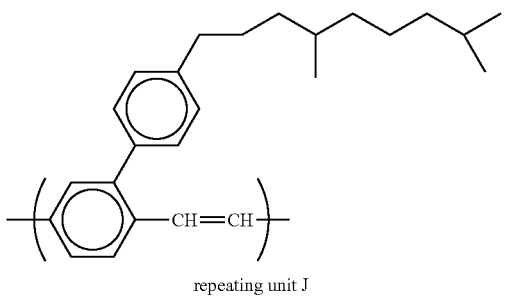

repeating unit J

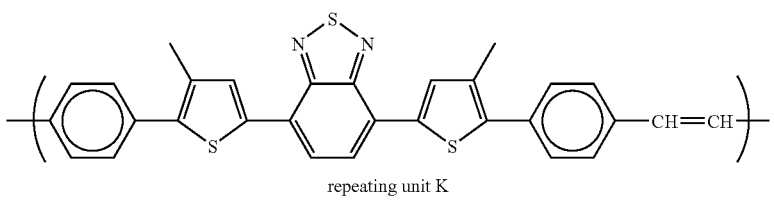

repeating unit K

EXAMPLE 2

Synthesis of Polymer Compound 2

0.441 g of a monomer (4) of the following structural formula:

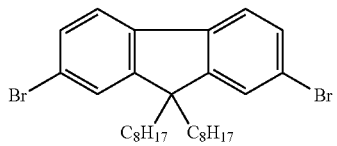

0.127 g of a monomer (5) of the following structural formula:

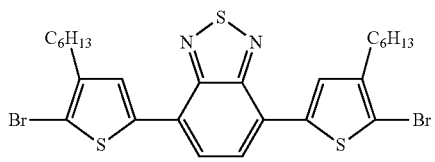

0.352 g of a monomer (100) {[1-cis-1,2-Bis(4,4,5,5-tetramethyl-1,3,2-dioxaborolan-2-yl)heptene] manufactured by Wako Pure Chemical Industries Ltd.} of the following structural formula:

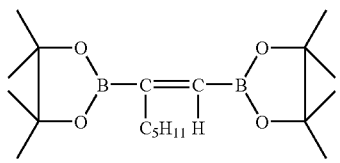

0.13 g of methyltrioctylammonium chloride (trade name: aliquat 336, manufactured by Aldrich, $CH_3N[(CH_2)_7CH_3]_3Cl$, density 0.884 g/ml, 25° C., trademark of Henkel Corporation) and 1.6 mg of dichlorobis(triphenylphosphine)palladium (II) were charged into an reaction vessel, and an atmosphere in the reaction vessel was purged with an argon gas sufficiently. To this reaction vessel was added 15 ml of toluene deaerated previously by bubbling with an argon gas. Next, into this solution, 5 ml of a 16.7 wt % $Na_2CO_3$ aqueous solution deaerated previously by bubbling with an argon gas was dropped in a period of several minutes, then, the mixture was heated and refluxed for 11 hours. The reaction was carried out under an argon gas atmosphere.

After completion of the reaction, the reaction solution was cooled down to around room temperature, then, to this reaction solution was added 40 g of toluene. This reaction solution was allowed to stand still and the liquid-partitioned toluene solution was recovered, Next, this toluene solution was filtrated to remove insoluble materials, then, this toluene solution was purified by passing through an alumina column. Next, this toluene solution was concentrated under reduced pressure, then, poured into methanol and purified by re-precipitation, and the generated precipitate was recovered. This precipitate was washed with methanol, then, dried under reduced pressure to obtain 0.3 g of a polymer. Hereinafter, this polymer is called "polymer compound 2". The polymer compound 2 had a polystyrene-reduced weight average molecular weight of $1.1 \times 10^4$ and a polystyrene-reduced number average molecular weight of $6.0 \times 10^3$.

The structures of repeating units contained in the polymer compound 2 estimated from charging are as described below, and the molar ratio estimated from charging is (repeating unit A+repeating unit A'):(repeating unit B+repeating unit B')=4:1.

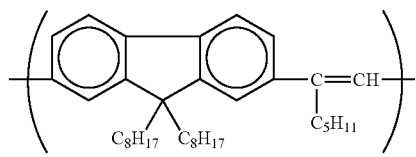

repeating unit A

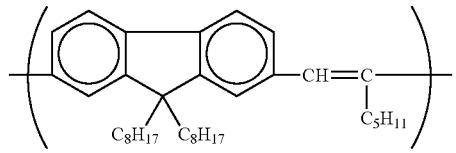

repeating unit A'

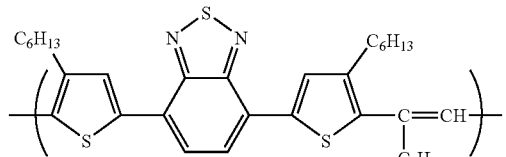

repeating unit B

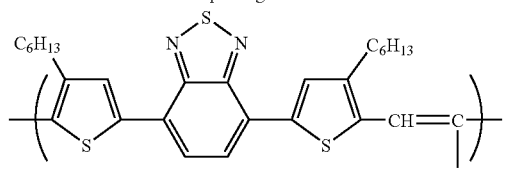

repeating unit B'

EXAMPLE 3

Synthesis of Polymer Compound 3

0.440 g of the above-described monomer (4), 0.126 g of the above-described monomer (5), 0.357 g of a monomer (200) {[cis-1,2-Bis(4,4,5,5-tetramethyl-1,3,2-dioxaborolan-2-yl)styrene] manufactured by Aldrich} of the following structural formula:

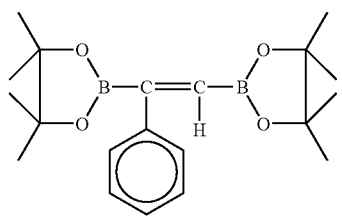

0.13 g of methyltrioctylammonium chloride (trade name: aliquat 336, manufactured by Aldrich, $CH_3N[(CH_2)_7CH_3]_3Cl$, density 0.884 g/ml, 25° C., trademark of Henkel Corporation) and 1.6 mg of dichlorobis(triphenylphosphine)palladium (II) were charged into an reaction vessel, and an atmosphere in the reaction vessel was purged with an argon gas sufficiently. To this reaction vessel was added 15 ml of toluene deaerated previously by bubbling with an argon gas. Next, into this solution, 5 ml of a 16.7 wt % $Na_2CO_3$ aqueous solution deaerated previously by bubbling with an argon gas was dropped in a period of several minutes, then, the mixture was heated and refluxed for 11 hours. The reaction was carried out under an argon gas atmosphere.

After completion of the reaction, the reaction solution was cooled down to around room temperature, then, to this reaction solution was added 40 g of toluene. This reaction solution was allowed to stand still and the liquid-partitioned toluene solution was recovered, Next, this toluene solution was filtrated to remove insoluble materials, then, this toluene solution was purified by passing through an alumina column. Next, this toluene solution was concentrated under reduced pressure, then, poured into methanol and purified by re-precipitation, and the generated precipitate was recovered. This precipitate was washed with methanol, then, dried under reduced pressure to obtain 0.3 g of a polymer. Hereinafter, this polymer is called "polymer compound 3". The polymer compound 3 had a polystyrene-reduced weight average molecular weight of $8.7 \times 10^3$ and a polystyrene-reduced number average molecular weight of $4.8 \times 10^3$.

The structures of repeating units contained in the polymer compound 3 estimated from charging are as described below, and the molar ratio estimated from charging is (repeating unit C+repeating unit C'):(repeating unit D+repeating unit D')=4:1.

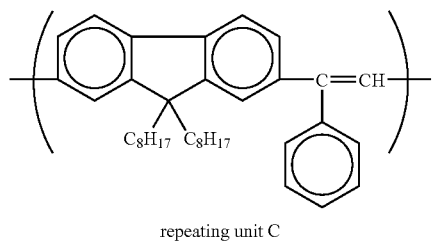

repeating unit C

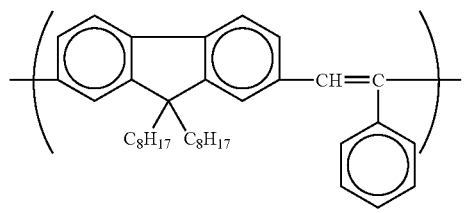

repeating unit C'

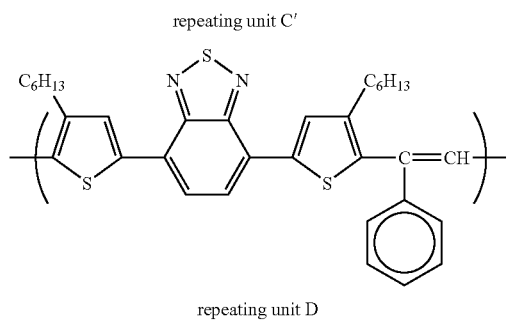

repeating unit D

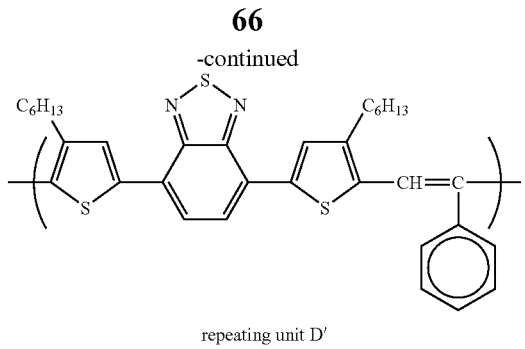

repeating unit D'

EXAMPLE 4

Synthesis of Polymer Compound 4

0.277 g of the above-described monomer (4), 0.313 g of the above-described monomer (5), 0.356 g of the above-described monomer (100), 0.10 g of methyltrioctylammonium chloride (trade name: aliquat 336, manufactured by Aldrich, $CH_3N[(CH_2)_7CH_3]_3Cl$, density 0.884 g/ml, 25° C., trademark of Henkel Corporation) and 1.2 mg of dichlorobis(triphenylphosphine)palladium (II) were charged into an reaction vessel, and an atmosphere in the reaction vessel was purged with an argon gas sufficiently. To this reaction vessel was added 15 ml of toluene deaerated previously by bubbling with an argon gas. Next, into this solution, 5 ml of a 16.7 wt % $Na_2CO_3$ aqueous solution deaerated previously by bubbling with an argon gas was dropped in a period of several minutes, then, the mixture was heated and refluxed for 10 hours. The reaction was carried out under an argon gas atmosphere.

After completion of the reaction, the reaction solution was cooled down to around room temperature, then, to this reaction solution was added 40 g of toluene. This reaction solution was allowed to stand still and the liquid-partitioned toluene solution was recovered. Next, this toluene solution was filtrated to remove insoluble materials, then, this toluene solution was purified by passing through an alumina column. Next, this toluene solution was concentrated under reduced pressure, then, poured into methanol and purified by re-precipitation, and the generated precipitate was recovered. This precipitate was washed with methanol, then, dried under reduced pressure to obtain 0.3 g of a polymer. Hereinafter, this polymer is called "polymer compound 4". The polymer compound 4 had a polystyrene-reduced weight average molecular weight of $8.5 \times 10^3$ and a polystyrene-reduced number average molecular weight of $4.7 \times 10^3$.

The structures of repeating units contained in the polymer compound 4 estimated from charging are as described below, and the molar ratio estimated from charging is (repeating unit E+repeating unit E'):(repeating unit F+repeating unit F')=1:1.

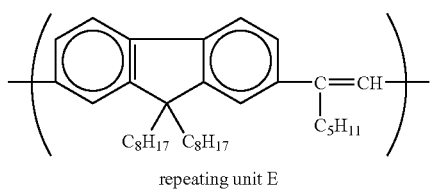

repeating unit E

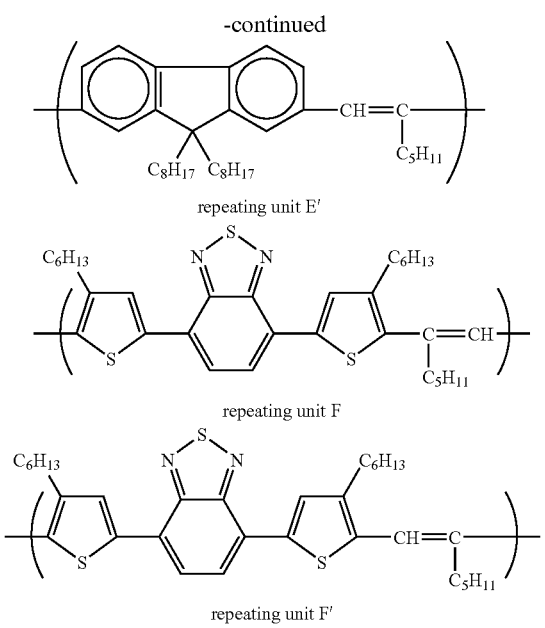

repeating unit E' repeating unit F repeating unit F'

EXAMPLE 5

Synthesis of Polymer Compound 5

0.414 g of a monomer (6) of the following structural formula:

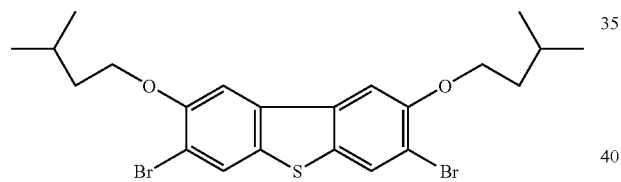

0.125 g of the above-described monomer (5), 0.356 g of the above-described monomer (200), 0.15 g of methyltrioctylammonium chloride (trade name: aliquat 336, manufactured by Aldrich, $CH_3N[(CH_2)_7CH_9]_3Cl$, density 0.884 g/ml, 25° C., trademark of Henkel Corporation) and 1.8 mg of dichlorobis(triphenylphosphine)palladium (II) were charged into an reaction vessel, and an atmosphere in the reaction vessel was purged with an argon gas sufficiently. To this reaction vessel was added 15 ml of toluene deaerated previously by bubbling with an argon gas. Next, into this solution, 6 ml of a 16.7 wt % $Na_2CO_3$ aqueous solution deaerated previously by bubbling with an argon gas was dropped in a period of several minutes, then, the mixture was heated and refluxed for 10 hours. The reaction was carried out under an argon gas atmosphere.

After completion of the reaction, the reaction solution was cooled down to around room temperature, then, to this reaction solution was added 30 ml of toluene. This reaction solution was allowed to stand still and the liquid-partitioned toluene solution was recovered. Next, the resultant toluene solution was poured into methanol slowly to cause re-precipitation, and the generated precipitate was recovered. This precipitate was dried under reduced pressure, then, the resultant precipitate was dissolved in toluene. The resultant toluene solution was filtered, then, purified by passing through an alumina column. Next, the resultant toluene solution was poured into methanol slowly to cause re-precipitation, and the generated precipitate was recovered. This precipitate was washed with methanol, then, dried under reduced pressure to obtain 0.1 g of a polymer. This polymer is called "polymer compound 5". The polymer compound 5 had a polystyrene-reduced weight average molecular weight of $5.7 \times 10^3$ and a polystyrene-reduced number average molecular weight of $3.2 \times 10^3$.

The structures of repeating units contained in the polymer compound 5 estimated from charging are as described below, and the molar ratio estimated from charging is (repeating unit AA+repeating unit AA'):(repeating unit BB+repeating unit BB')=8:2.

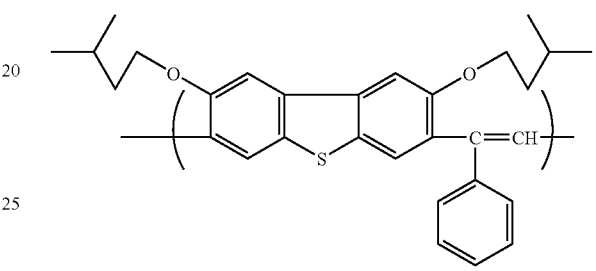

repeating unit AA

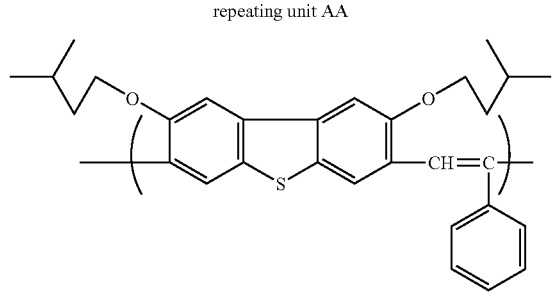

repeating unit AA'

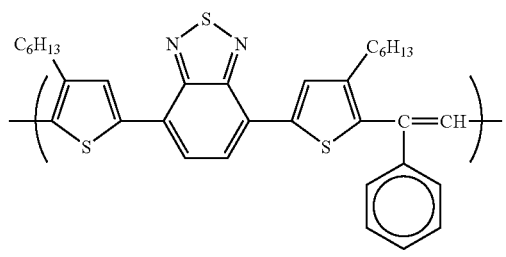

repeating unit BB

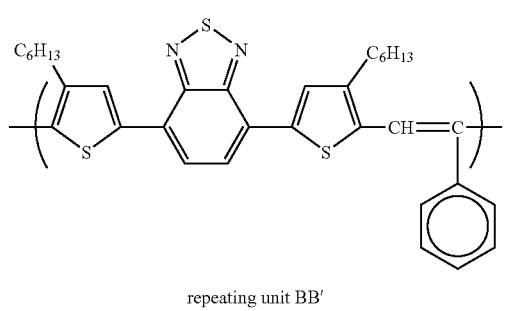

repeating unit BB'

EXAMPLE 6

Synthesis of Polymer Compound 6

0.797 g of a monomer (7) of the following structural formula:

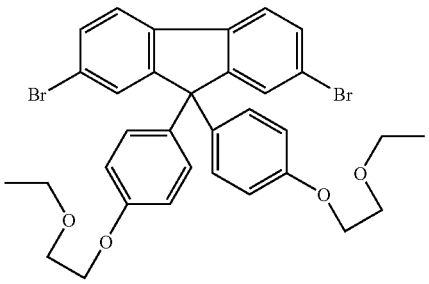

0.184 g of a monomer (8) of the following structural formula:

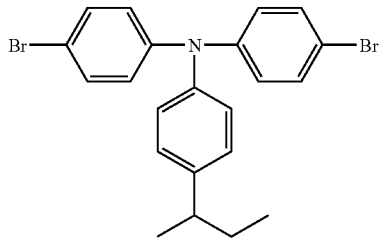

0.251 g of the above-described monomer (5), 0.712 g of the above-described monomer (200), 0.30 g of methyltrioctylammonium chloride (trade name: aliquat 336, manufactured by Aldrich, $CH_3N[(CH_2)_7CH_3]_3Cl$, density 0.884 g/ml, 25° C., trademark of Henkel Corporation) and 3.7 mg of dichlorobis (triphenylphosphine)palladium (II) were charged into an reaction vessel, and an atmosphere in the reaction vessel was purged with an argon gas sufficiently. To this reaction vessel was added 30 ml of toluene deaerated previously by bubbling with an argon gas. Next, into this solution, 10 ml of a 16.7 wt % $Na_2CO_3$ aqueous solution deaerated previously by bubbling with an argon gas was dropped in a period of several minutes, then, the mixture was heated and refluxed for 10 hours. The reaction was carried out under an argon gas atmosphere.

After completion of the reaction, the reaction solution was cooled down to around room temperature, then, to this reaction solution was added 30 ml of toluene. This reaction solution was allowed to stand still and the liquid-partitioned toluene solution was recovered. Next, this toluene solution was filtrated to remove insoluble materials, then, the resultant toluene solution was poured into methanol slowly to cause re-precipitation, and the generated precipitate was recovered. This precipitate was dried under reduced pressure, then, the resultant precipitate was dissolved in toluene. The resultant toluene solution was filtrated, then, purified by passing through an alumina column. Next, the resultant toluene solution was poured into methanol slowly to cause re-precipitation, and the generated precipitate was recovered. This precipitate was washed with methanol, then, dried under reduced pressure to obtain 0.15 g of a polymer. This polymer is called "polymer compound 6". The polymer compound 6 had a polystyrene-reduced weight average molecular weight of $4.4 \times 10^3$ and a polystyrene-reduced number average molecular weight of $2.9 \times 10^3$.

The structures of repeating units contained in the polymer compound 6 estimated from charging are as described below, and the molar ratio estimated from charging is (repeating unit CC+repeating unit CC'):(repeating unit DD+repeating unit DD'):(repeating unit EE+repeating unit EE')=6:2:2.

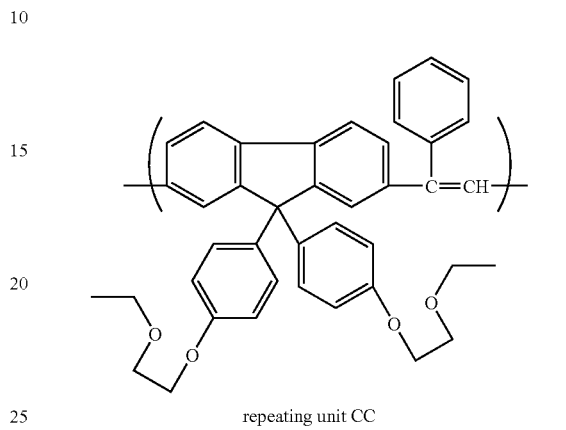

repeating unit CC

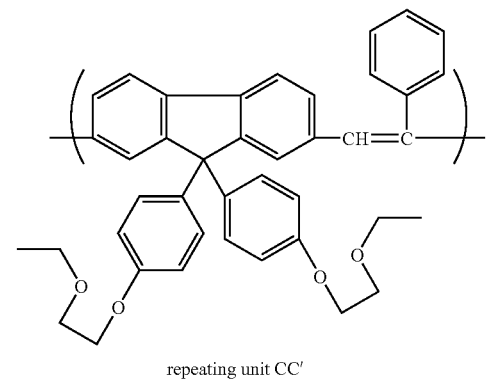

repeating unit CC'

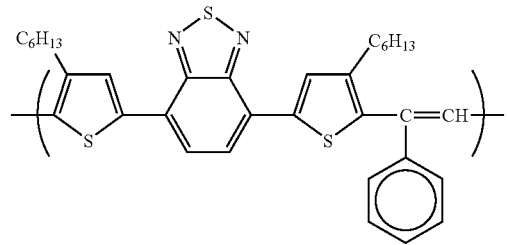

repeating unit DD

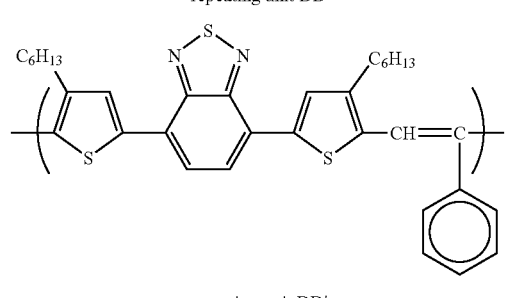

repeating unit DD'

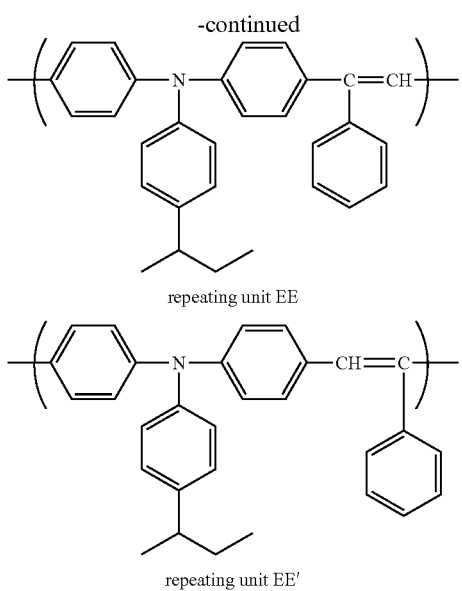

repeating unit EE repeating unit EE'

EXAMPLE 7

Synthesis of Polymer Compound 7

1.040 g of a monomer (9) of the following structural formula:

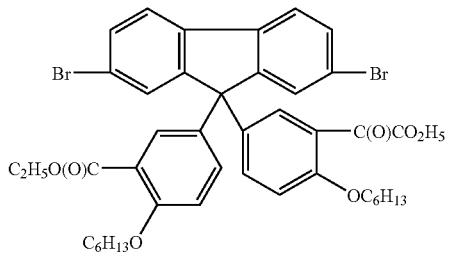

0.189 g of a monomer (10) of the following structural formula:

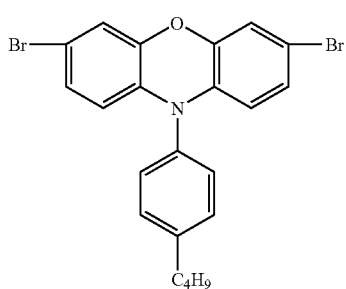

0.251 g of the above-described monomer (5), 0.728 g of the above-described monomer (100), 0.30 g of methyltrioctylammonium chloride (trade name: aliquat 336, manufactured by Aldrich, $CH_3N[(CH_2)_7CH_3]_3Cl$, density 0.884 g/ml, 25° C., trademark of Henkel Corporation) and 3.6 mg of dichlorobis (triphenylphosphine)palladium (II) were charged into an reaction vessel, and an atmosphere in the reaction vessel was purged with an argon gas sufficiently. To this reaction vessel was added 30 ml of toluene deaerated previously by bubbling with an argon gas. Next, into this solution, 10 ml of a 16.7 wt % $Na_2CO_3$ aqueous solution deaerated previously by bubbling with an argon gas was dropped in a period of several minutes, then, the mixture was heated and refluxed for 10 hours. The reaction was carried out under an argon gas atmosphere.

After completion of the reaction, the reaction solution was cooled down to around room temperature, then, to this reaction solution was added 30 ml of toluene. This reaction solution was allowed to stand still and the liquid-partitioned toluene solution was recovered. Next, this toluene solution was filtrated to remove insoluble materials, then, the resultant toluene solution was poured into methanol slowly to cause re-precipitation, and the generated precipitate was recovered. This precipitate was dried under reduced pressure, then, the resultant precipitate was dissolved in toluene. The resultant toluene solution was filtrated, then, purified by passing through an alumina column. Next, the resultant toluene solution was poured into methanol slowly to cause re-precipitation, and the generated precipitate was recovered. This precipitate was washed with methanol, then, dried under reduced pressure to obtain 0.12 g of a polymer. This polymer is called "polymer compound 7". The polymer compound 7 had a polystyrene-reduced weight average molecular weight of $5.1\times10^3$ and a polystyrene-reduced number average molecular weight of $3.1\times10^3$.

The structures of repeating units contained in the polymer compound 7 estimated from charging are as described below, and the molar ratio estimated from charging is (repeating unit FF+repeating unit FF'):(repeating unit GG+repeating unit GG'):(repeating unit HH+repeating unit HH')=6:2:2.

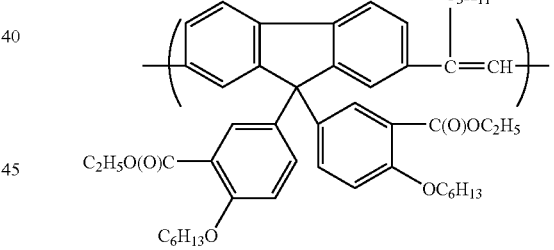

repeating unit FF

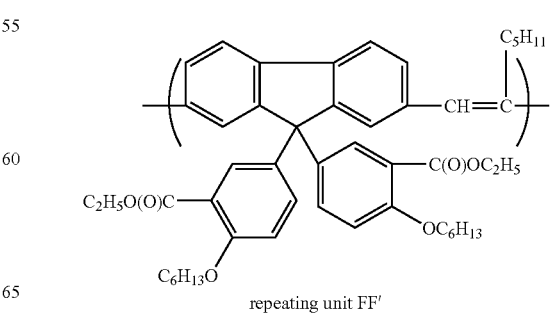

repeating unit FF'

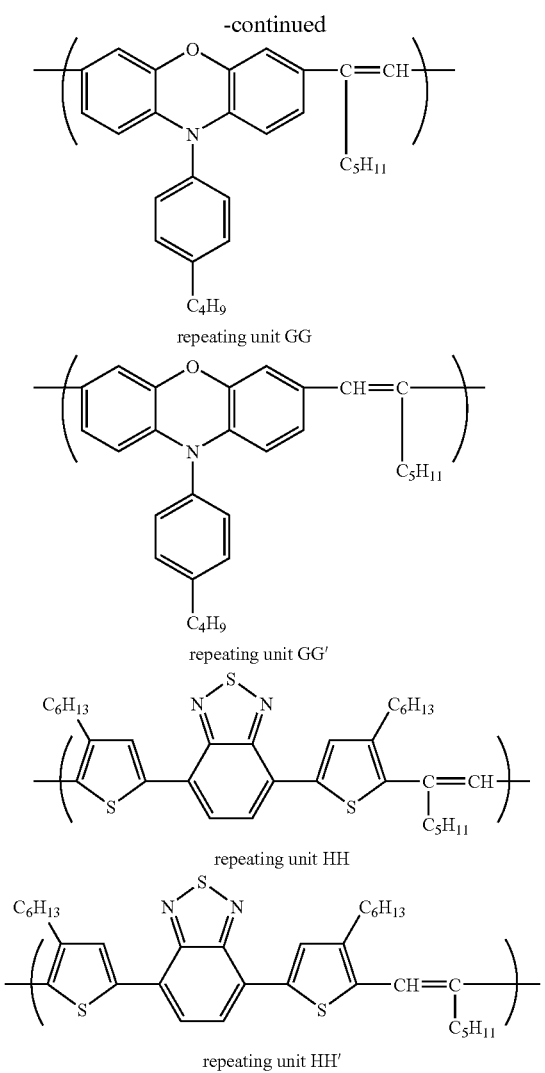

repeating unit GG repeating unit GG' repeating unit HH repeating unit HH'

EXAMPLE 8

Synthesis of Polymer Compound 8

0.987 g of the above-described monomer (4), 0.250 g of the above-described monomer (5), 0.712 g of the above-described monomer (200), 0.36 g of methyltrioctylammonium chloride (trade name: aliquat 336, manufactured by Aldrich, $CH_3N[(CH_2)_7CH_3]_3Cl$, density 0.884 g/ml, 25° C., trademark of Henkel Corporation) and 3.6 mg of dichlorobis(triphenylphosphine)palladium (II) were charged into an reaction vessel, and an atmosphere in the reaction vessel was purged with an argon gas sufficiently. To this reaction vessel was added 30 ml of toluene deaerated previously by bubbling with an argon gas. Next, into this solution, 10 ml of a 16.7 wt % $Na_2CO_3$ aqueous solution deaerated previously by bubbling with an argon gas was dropped in a period of several minutes, then, the mixture was heated and refluxed for 10 hours. The reaction was carried out under an argon gas atmosphere.

After completion of the reaction, the reaction solution was cooled down to around room temperature, then, to this reaction solution was added 15 ml of toluene. This reaction solution was allowed to stand still and the liquid-partitioned toluene solution was recovered. Next, this toluene solution was filtrated to remove insoluble materials, then, the resultant toluene solution was poured into methanol slowly to cause re-precipitation, and the generated precipitate was recovered. This precipitate was dried under reduced pressure, then, the resultant precipitate was dissolved in toluene. The resultant toluene solution was filtrated, then, purified by passing through an alumina column. Next, the resultant toluene solution was poured into methanol slowly to cause re-precipitation, and the generated precipitate was recovered. This precipitate was washed with methanol, then, dried under reduced pressure to obtain 0.48 g of a polymer. This polymer is called "polymer compound 8". The polymer compound 8 had a polystyrene-reduced weight average molecular weight of $4.9 \times 10^3$ and a polystyrene-reduced number average molecular weight of $3.3 \times 10^3$.

The structures of repeating units contained in the polymer compound 8 estimated from charging are as described below, and the molar ratio estimated from charging is (repeating unit II+repeating unit II'):(repeating unit JJ+repeating unit JJ')=9:1.

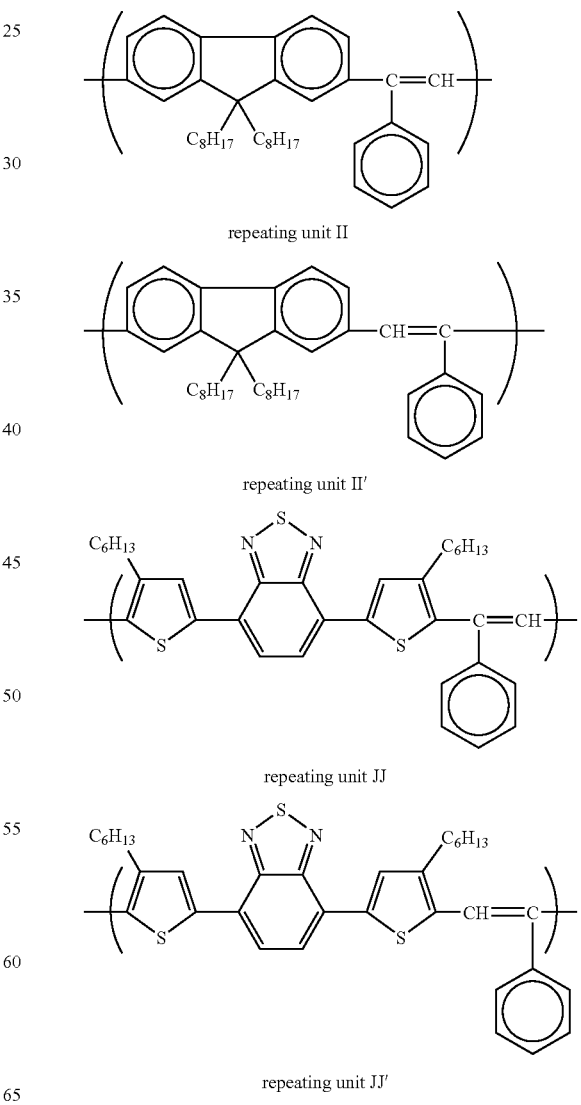

repeating unit II repeating unit II' repeating unit JJ repeating unit JJ'

EXAMPLE 9

Evaluation of Fluorescent Property 0.8 wt % toluene solutions of the polymer compounds 1 to 8 were spin-coated on a quartz plate to manufacture thin films of the polymer compounds 1 to 8. Using these thin films, the fluorescence spectra of the polymer compounds 1 to 8 were measured by a fluorescence spectrophotometer (manufactured by JOBINYVON-SPEX, trade name: Fluorolog) at an excitation wavelength of 350 nm, and the absorption spectra thereof were measured by a spectrophotometer (manufactured by Varian, trade name: Cary5E).

Thus obtained measurement results of the absorption peak wavelengths and fluorescence peak wavelengths of the polymer compounds 1 to 8 are shown in Table 1. The polymer compounds 1 to 8 of the present invention showed red fluorescence.

TABLE 1

Absorption peak wavelengths and fluorescence peak wavelengths of polymer compounds

| | absorption peak wavelength (nm) | fluorescence peak wavelength (nm) |
|---|---|---|
| polymer compound 1 | 411 | 627 |
| polymer compound 2 | 337, 532 | 666 |
| polymer compound 3 | 373, 548 | 671 |
| polymer compound 4 | 328, 530 | 676 |
| polymer compound 5 | 363, 545 | 672 |
| polymer compound 6 | 376, 542 | 681 |
| polymer compound 7 | 314, 528 | 681 |
| polymer compound 8 | 372, 549 | 671 |

EXAMPLE 10

Manufacturing and Evaluation of Device

On a glass substrate carrying an ITO film having a thickness of about 150 nm formed by a sputtering methods a solution of poly(ethylenedioxythiophene)/polystyrenesulfonic acid (manufactured by Bayer, trade name: Baytron) was spin-coated to form a film with a thickness of about 50 nm, and dried on a hot plate at 120° C. for 5 minutes. Next, a ca. 1.5 wt % toluene solution of the polymer compound 1 was spin-coated to form a film with a thickness of about 70 nm. Further, this was dried at 80° C. for about 1 hour under reduced pressure, then, lithium fluoride was vapor-deposited with a thickness of about 4 nm, then, as a cathode, calcium was vapor-deposited with a thickness of about 20 nm, then, aluminum was vapor-deposited with a thickness of about 50 nm, to manufacture a polymer light emitting device. By applying voltage on the resultant device, EL light emission (deep red) from the polymer compound 1 is obtained.

Also for the polymer compounds 2 to 8, polymer light emitting devices are manufactured likewise. By applying voltage on the resultant devices 2 to 8, EL light emission (deep red) from the polymer compounds is obtained.

INDUSTRIAL APPLICABILITY

The polymer compound of the present invention is excellent in bathochromaticity and useful as a light emitting material in the red region since it shows a peak wavelength of fluorescence spectrum in the longer wavelength side. The polymer compound of the present invention is also useful for thin films, organic transistors, solar batteries and the like since it shows an absorption end wavelength in the longer wavelength side. A polymer light emitting device using the polymer compound manifests high performance, thus, useful for sheet light sources, displays and the like.

The invention claimed is:

1. A polymer compound comprising a repeating unit of the following formula (1) and having a polystyrene-reduced number average molecular weight of $1\times10^3$ to $1\times10^8$:

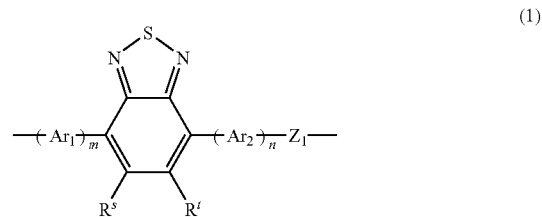

(1)

wherein, $Ar_1$ and $Ar_2$ represent each independently an optionally substituted arylene group, optionally divalent heterocyclic group or optionally substituted divalent aromatic amine group; when a plurality of $Ar_1$s and $Ar_2$s are present, these may be the same or different; $Z_1$ represents —$CR_1$=$CR_2$— or —C≡C—; here, $R_1$ and $R_2$ represent each independently a hydrogen atom, alkyl group, aryl group, monovalent heterocyclic group or cyano group; m and n represent each independently 1 or 2; and $R^s$ and $R^t$ represent each independently a hydrogen atom, alkyl group or alkoxy group.

2. The polymer compound according to claim 1, wherein the repeating unit of the formula (1) is a unit of the following formula (1a):

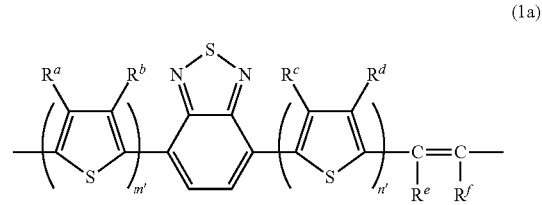

(1a)

wherein, $R^a$, $R^b$, $R^c$ and $R^d$ represent each independently a hydrogen atom, alkyl group, alkoxy group or aryl group; $R^e$ and $R^f$ represent each independently a hydrogen atom, alkyl group or aryl group; m' and n' represent each independently 1 or 2, and when a plurality of $R^a$s to $R^d$s are present, these may be the same or different.

3. The polymer compound according to claim 1, further comprising a repeating unit of the following formula (2):

—$Ar_5$—$Z_2$— (2)

wherein, $Ar_5$ represents an optionally substituted arylene group, optionally substituted divalent heterocyclic group or optionally substituted divalent aromatic amine group; $Z_2$ represents —$CR_3$=$CR_4$— or —C≡C—; and $R_3$ and $R_4$ represent each independently a hydrogen atom, alkyl group, aryl group, monovalent heterocyclic group or cyano group.

4. The polymer compound according to claim 3, wherein in said formula (2), the optionally substituted arylene group represented by $Ar_5$ is a group of the following formula (60):

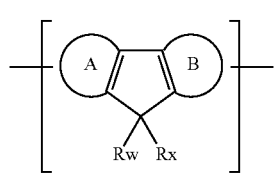

wherein, A ring and B ring represent each independently an optionally substituted aromatic hydrocarbon ring; two connecting bonds are present respectively on the A ring or the B ring; and Rw and Rx represent each independently a hydrogen atom, alkyl group, alkoxy group, alkylthio group, alkylsilyl group, alkylamino group, aryl group, aryloxy group, arylalkyl group, arylalkoxy group, arylalkynyl group, arylalkynyl group, arylamino group, monovalent heterocyclic group, acyl group, substituted carboxyl group or cyano group, and Rw and Rx may be mutually connected to form a ring.

5. The polymer compound according to claim 4, wherein said optionally substituted arylene group of the formula (60) is a group of any of the following formulae (2A) to (2D):

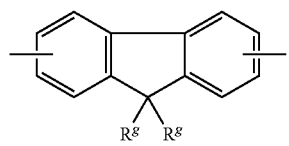
(2A)

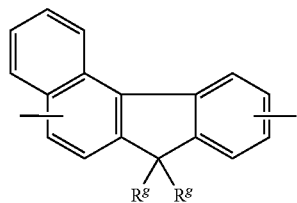
(2B)

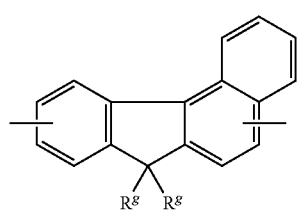
(2C)

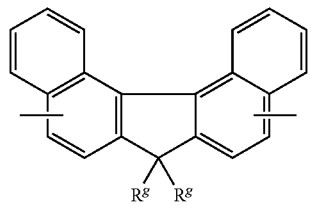
(2D)

wherein, $R^g$ represents a hydrogen atom, alkyl group or aryl group; two $R^g$s may be the same or different; and two $R^g$s may be mutually connected to form a ring.

6. The polymer compound according to claim 3, wherein in said formula (2), the optionally substituted divalent heterocyclic group represented by $Ar_5$ is a group of the following formula (70):

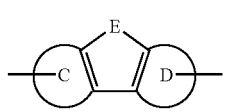

wherein, C ring and D ring represent each independently an aromatic ring; the C ring and D ring optionally have a substituent selected from the group consisting of alkyl groups, alkoxy groups, alkylthio groups, alkylsilyl groups, alkylamino groups, aryl groups, aryloxy groups, arylalkyl groups, arylalkoxy groups, arylalkynyl groups, arylalkynyl groups, arylamino groups, monovalent heterocyclic groups, acyl groups, acyloxy groups, substituted carboxyl groups and cyano group; when a plurality of substituents are present, they may be the same or different; and E represents O or S.

7. The polymer compound according to claim 6, wherein said optionally substituted divalent heterocyclic group of the formula (70) is a group of the following formula (2E):

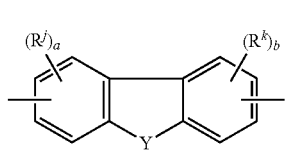

wherein, Y represents O or S; $R^j$ and $R^k$ represent each independently an alkyl group, alkoxy group or aryl group; and a and b represent each independently 0 or 1.

8. The polymer compound according to claim 3, wherein said group represented by $Z_2$ is $-CR_3=CR_4-$.

9. A composition comprising the polymer compound as described in claim 1, and a compound having a polystyrene-reduced number average molecular weight of $10^3$ to $10^8$ other than the polymer compound.

10. A polymer light emitting device having electrodes composed of an anode and a cathode, and a light emitting layer containing the polymer compound as described in claim 1 provided between the electrodes.

11. A sheet light source comprising the polymer light emitting device as described in claim 10.

12. A display comprising the polymer light emitting device as described in claim 10.

13. A liquid composition comprising the polymer compound as described in claim 1, and a solvent.

14. A thin film comprising the polymer compound as described in claim 1.

15. An organic transistor comprising the polymer compound as described in claim 1.

16. A solar battery comprising the polymer compound as described in claim 1.

* * * * *